United States Patent
Numata

(10) Patent No.: US 6,987,414 B2
(45) Date of Patent: Jan. 17, 2006

(54) HIGH FREQUENCY SWITCH CIRCUIT

(75) Inventor: Keiichi Numata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/470,788

(22) PCT Filed: Jan. 29, 2002

(86) PCT No.: PCT/JP02/00647

§ 371 (c)(1),
(2), (4) Date: Jul. 31, 2003

(87) PCT Pub. No.: WO02/061876

PCT Pub. Date: Aug. 8, 2002

(65) Prior Publication Data

US 2004/0085118 A1 May 6, 2004

(30) Foreign Application Priority Data

Feb. 1, 2001 (JP) ........................ 2001-025558

(51) Int. Cl.
H03K 17/00 (2006.01)

(52) U.S. Cl. .................. 327/365; 327/376; 327/377
(58) Field of Classification Search ............... 327/365, 327/493, 376, 377, 416, 417; 333/103, 104
See application file for complete search history.

(56) References Cited

U.S. PATENT DOCUMENTS 5,519,364 A * 5/1996 Kato et al. ................. 333/103
5,914,544 A * 6/1999 Tanaka et al. .............. 307/130

FOREIGN PATENT DOCUMENTS

| JP | 9-55682 | 2/1997 |
| JP | 10-242829 | * 9/1998 |
| JP | 10-335901 | 12/1998 |
| JP | 2001-217653 | 8/2001 |

OTHER PUBLICATIONS

PCT WO 02/061867 A1 (Jan. 29, 2002).*

Japanese Office Action dated Feb. 8, 2005 with Partial English Translation.

* cited by examiner

Primary Examiner—My-Trang Nu Ton
Assistant Examiner—Hiep Nguyen
(74) Attorney, Agent, or Firm—McGinn & Gibb, PLLC

(57) ABSTRACT

A high frequency switch circuit including high frequency terminals which input/output a high frequency signal, high frequency semiconductor switch sections which are arranged on lines coupling the high frequency terminals, a DC potential isolating circuit which isolates the plurality of high frequency semiconductors switch sections from each other in a DC state, and DC potential transmission sections. Each DC potential transmission section couples a control side of an associated high frequency semiconductor switching section to at least one of an input side and an output side of another one of the plurality of high frequency semiconductor switch sections.

20 Claims, 18 Drawing Sheets

HIGH FREQUENCY SWITCH CIRCUIT

TECHNICAL FIELD

The present invention relates to a high frequency switch circuit used in high frequency communication of a portable cellular phone set and the like.

BACKGROUND ART

FIG. 1 is a circuit diagram showing the first prior art of a high frequency switch circuit. The first prior art will be explained with reference to FIG. 1.

The first prior art concerns an SPDT circuit (Single Pole Double Transfer) disclosed in Japanese Unexamined Patent Publication No. 8-139014. The drains and sources of field effect transistors 1 to 5 are cascade-connected between high frequency terminals 101 and 102. The drains and sources of field effect transistors 6 to 10 are cascade-connected between the high frequency terminal 101 and a high frequency terminal 103. The gate electrodes of the field effect transistors 1 to 10 are connected to resistance elements 51 to 60. The resistance elements 51 to 55 connected to the gate electrodes of the field effect transistors 1 to 5 are connected to a switching signal terminal 111. The resistance elements 56 to 60 connected to the gate electrodes of the field effect transistors 6 to 10 are connected to a switching signal terminal 112.

Voltages at opposite levels are input to the switching signal terminals 111 and 112. When high level is input to the switching signal terminal 111 and low level is input to the switching signal terminal 112, the field effect transistors 1 to 5 are turned on, the field effect transistors 6 to 10 are turned off, and the high frequency terminals 101 and 102 are rendered conductive. When low level is input to the switching signal terminal 111 and high level is input to the switching signal terminal 112, the field effect transistors 1 to 5 are turned off, the field effect transistors 6 to 10 are turned on, and the high frequency terminals 101 and 103 are rendered conductive.

FIG. 2 is a circuit diagram showing the second prior art of a high frequency switch circuit. The second prior art will be explained with reference to FIG. 2.

The second prior art concerns an SPDT circuit disclosed in Japanese Unexamined Patent Publication No. 8-213893. High frequency terminals 101 and 102 are connected by a field effect transistor 1, and the high frequency terminal 101 and a high frequency terminal 103 are connected by a field effect transistor 2. The high frequency terminal 102 is grounded via the drain-source path of a field effect transistor 3 and a capacitive element 71. The high frequency terminal 103 is grounded via the drain-source path of a field effect transistor 4 and a capacitive element 72. The gate electrodes of the field effect transistors 1 to 4 are connected to resistance elements 51 to 54, respectively. The resistance element 51 connected to the gate electrode of the field effect transistor 1 and the resistance element 54 connected to the gate electrode of the field effect transistor 4 are connected to a switching signal terminal 111. The resistance element 52 connected to the gate electrode of the field effect transistor 2 and the resistance element 53 connected to the gate electrode of the field effect transistor 3 are connected to a switching signal terminal 112. The high frequency terminals 101 to 103 and the source electrodes of the field effect transistors 3 and 4 are connected to an external power supply 300 via resistance elements 55 to 59.

Voltages at opposite levels are input to the switching signal terminals 111 and 112. The high frequency terminals 101 to 103 and the source electrodes of the field effect transistors 3 and 4 receive the potential of the external power supply 300 via the resistance elements 55 to 59. When high level is input to the switching signal terminal 111 and low level is input to the switching signal terminal 112, the field effect transistors 1 and 4 are turned on, the field effect transistors 2 and 3 are turned off, and the high frequency terminals 101 and 102 are rendered conductive. When low level is input to the switching signal terminal 111 and high level is input to the switching signal terminal 112, the field effect transistors 1 and 4 are turned off, the field effect transistors 2 and 3 are turned on, and the high frequency terminals 101 and 103 are rendered conductive.

The SPDT circuit is incorporated in, e.g., a portable cellular phone set, and functions as a high frequency transmission/reception signal switch. The field effect transistor used in the high frequency switch circuit is, e.g., a depletion n-channel GaAs MESFET, and is turned on at 0 [V] and off at −3 [V].

The conventional high frequency switch circuit suffers the following problems.

In the first prior art, no potential is externally applied to a high frequency terminal, and high frequency terminals at the two terminals (drain and source sides) of an ON field effect transistor are set to almost the same potential as high level. The potential difference between the gate and the source becomes almost 0 [V], and the ON resistance cannot be sufficiently reduced. That is, the transmission loss increases.

In the second prior art, a potential is externally applied to a high frequency terminal, and a gate-source potential Vgs can be positively increased depending on an application potential VC. The ON resistance can be reduced, and as a result, the transmission loss can be reduced. A maximum handling power Pmax which can be handled by a circuit constituted by cascade-connecting n field effect transistors is given by $$P\max=2\{n(VC-VL+VT)\}2/Zo$$

(where VL is low level, VT is the threshold voltage of the field effect transistor, and Zo is the evaluation system impedance in the switch circuit.)

The difference between low level (VL) and VC becomes small, decreasing handling power. To increase handling power, the number of cascade-connected field effect transistors must be increased. An external power supply is undesirably required.

In other words, in the conventional high frequency switch circuit, signal transmission paths are DC-connected. If Vgs of an ON switch is positively increased to reduce the ON resistance, handling power decreases in an OFF switch. If Vgs of an OFF switch is negatively increased to increase handling power, the ON resistance of an ON switch increases.

DISCLOSURE OF INVENTION

The present invention has been made in consideration of the above situation in the prior art, and has as its object to provide a high frequency switch circuit which meets both low transmission loss and high handling power.

To achieve the above object, according to the first aspect of the present invention, there is provided a high frequency switch circuit characterized by comprising a plurality of high frequency terminals which input/output a high frequency signal, and a plurality of high frequency semiconductor switch sections which switch between the high frequency terminals, wherein the plurality of high frequency semiconductor switch sections are isolated from each other in a DC state. To enable a high frequency semiconductor switch section to achieve this, a DC potential of one level is applied to a control side of one high frequency semiconductor switch section, while a DC potential of the opposite level is applied to at least one of an input side and an output side of another high frequency semiconductor switch section.

The "high frequency semiconductor switch section" is mainly comprised of a semiconductor switch element such as a field effect transistor or bipolar transistor, and will be referred to as a "high frequency semiconductor switch section" hereinafter. The "DC potential of the one level" and the "DC potential of the opposite level" mean a DC potential for opening the high frequency semiconductor switch section when a DC potential for closing the high frequency semiconductor switch section is applied to the control side, and a DC potential for closing the high frequency semiconductor switch section when a DC potential for opening the high frequency semiconductor switch section is applied to the control side.

The high frequency semiconductor switch sections are isolated from each other in the DC state. The input side or output side of each high frequency semiconductor switch section receives a DC potential opposite in level to the DC potential applied to the control side. A high frequency semiconductor switch section which is closed upon application of a high-level potential to the control side will be explained. When a high-level potential is applied to the control side, a low-level potential is applied to the input side or output side. The control voltage becomes much higher than the input/output voltage, and the ON transmission resistance value decreases. When a low-level potential is applied to the control side, a high-level potential is applied to the input side or output side. The control voltage becomes much lower than the input voltage, and the OFF handling power increases. As for a high frequency semiconductor switch section which is closed upon application of a low-level potential, the level of the DC potential in the above description is reversed.

According to the second aspect of the present invention, there is provided a high frequency switch circuit characterized in that the plurality of high frequency semiconductor switch sections in the first aspect include field effect transistors having drain electrodes and source electrodes which are connected between the high frequency terminals, the plurality of high frequency semiconductor switch sections are isolated from each other by capacitive elements, and a DC potential of one level is applied to a gate electrode of one field effect transistor, while a DC potential of the opposite level is applied to at least one of the drain electrode and the source electrode of that transistor.

According to the third aspect of the present invention, there is provided a high frequency switch circuit characterized in that the plurality of high frequency semiconductor switch sections in the first aspect include a plurality of field effect transistors having drain electrodes and source electrodes which are series-connected between the high frequency terminals, the plurality of high frequency semiconductor switch sections are isolated from each other by capacitive elements, and a DC potential opposite in level to a DC potential applied to gate electrodes is applied to at least either of the drain electrodes and the source electrodes at both sides of the plurality of field effect transistors.

According to the fourth aspect of the present invention, there is provided a high frequency switch circuit comprising first to third high frequency terminals which input/output a high frequency signal, a first high frequency semiconductor switch section which switches between the third high frequency terminal and the first high frequency terminal, a second high frequency semiconductor switch section which switches between the third high frequency terminal and the second high frequency terminal, a first switching signal terminal which controls switching operation of the first high frequency semiconductor switch section, a second switching signal terminal which controls switching operation of the second high frequency semiconductor switch section, a DC potential isolating section which is connected between the third high frequency terminal and the first and second high frequency semiconductor switch sections, and isolates the first high frequency semiconductor switch section and the second high frequency semiconductor switch section in a DC state, a first potential transmission section which is connected between the second switching signal terminal and the first high frequency terminal, and applies to the first high frequency terminal a DC potential applied to the second switching signal terminal, and a second potential transmission section which is connected between the first switching signal terminal and the second high frequency terminal, and applies to the second high frequency terminal a DC potential applied to the first switching signal terminal.

According to the fifth aspect of the present invention, there is provided a high frequency switch circuit comprising first to fourth high frequency terminals which input/output a high frequency signal, a first high frequency semiconductor switch section which switches between the first high frequency terminal and the second high frequency terminal, a second high frequency semiconductor switch section which switches between the second high frequency terminal and the third high frequency terminal, a third high frequency semiconductor switch section which switches between the third high frequency terminal and the fourth high frequency terminal, a fourth high frequency semiconductor switch section which switches between the fourth high frequency terminal and the first high frequency terminal, a first switching signal terminal which controls switching operation of the first and third high frequency semiconductor switch sections, a second switching signal terminal which controls switching operation of the second and fourth high frequency semiconductor switch sections, a first DC potential isolating section which is connected between the first high frequency terminal and the fourth and first high frequency semiconductor switch sections, and isolates the fourth high frequency semiconductor switch section and the first high frequency semiconductor switch section in a DC state, a second DC potential isolating section which is connected between the second high frequency terminal and the first and second high frequency semiconductor switch sections, and isolates the first high frequency semiconductor switch section and the second high frequency semiconductor switch section in the DC state, a third DC potential isolating section which is connected between the third high frequency terminal and the second and third high frequency semiconductor switch sections, and isolates the second high frequency semiconductor switch section and the third high frequency semiconductor switch section in the DC state, a fourth DC potential isolating section which is connected between the fourth high frequency terminal and the third and fourth high frequency semiconductor switch sections, and isolates the third high frequency semiconductor switch section and the fourth high frequency semiconductor switch section in the DC state, a first potential transmission section which is connected between the second switching signal terminal and at least one of an input side and an output side of the first high frequency semiconductor switch section, and applies to at least one of the input side and the output side a DC potential applied to the second switching signal terminal, a second potential transmission section which is connected between the first switching signal terminal and at least one of an input side and an output side of the second high frequency semiconductor switch section, and applies to at least one of the input side and the output side a DC potential applied to the first switching signal terminal, a third potential transmission section which is connected between the second switching signal terminal and at least one of an input side and an output side of the third high frequency semiconductor switch section, and applies to at least one of the input side and the output side a DC potential applied to the second switching signal terminal, and a fourth potential transmission section which is connected between the first switching signal terminal and at least one of an input side and an output side of the fourth high frequency semiconductor switch section, and applies to at least one of the input side and the output side a DC potential applied to the first switching signal terminal.

Two potential transmission sections are adopted for connection to both the input side and output side of the high frequency semiconductor switch section. One potential transmission section is adopted for connection to either the input side or output side.

According to the sixth aspect of the present invention, the DC potential isolating section in the fourth and fifth aspects includes a capacitive element which is connected between the high frequency terminal connected to the DC potential isolating section and one high frequency semiconductor switch section connected to the DC potential isolating section, or between the high frequency terminal connected to the DC potential isolating section and the other high frequency semiconductor switch section connected to the DC potential isolating section.

According to the seventh aspect of the present invention, the DC potential isolating section in the fourth to sixth aspects comprises a field effect transistor having a drain electrode and a source electrode which are connected between the high frequency terminal connected to the DC potential isolating section and one high frequency semiconductor switch section connected to the DC potential isolating section, a field effect transistor having a drain electrode and a source electrode which are connected between the high frequency terminal connected to the DC potential isolating section and the other high frequency semiconductor switch section connected to the DC potential isolating section, and a resistance element which is connected between a gate electrode of each field effect transistor and the switching signal terminal.

According to the eighth aspect of the present invention, the DC potential isolating section in the fourth to sixth aspects comprises a field effect transistor having a drain electrode and a source electrode which are connected between the high frequency terminal connected to the DC potential isolating section and one high frequency semiconductor switch section connected to the DC potential isolating section, a field effect transistor having a drain electrode and a source electrode which are connected between the high frequency terminal connected to the DC potential isolating section and the other high frequency semiconductor switch section connected to the DC potential isolating section, a resistance element which is connected between a gate electrode of each field effect transistor and the switching signal terminal, and a resistance element which is connected between the drain electrode and the source electrode of each field effect transistor.

According to the ninth aspect of the present invention, the high frequency semiconductor switch section in the fourth to eighth aspects comprises a field effect transistor having a drain electrode and a source electrode which are connected between the high frequency terminals connected/disconnected by the high frequency semiconductor switch section, a resistance element which is connected between a gate electrode of the field effect transistor and the switching signal terminal for controlling the high frequency semiconductor switch section, and a resistance element which is connected between the drain electrode and the source electrode.

According to the tenth aspect of the present invention, the high frequency semiconductor switch section in the fourth to eighth aspects comprises a plurality of field effect transistors having drain electrodes and source electrodes which are series-connected between the high frequency terminals connected/disconnected by the high frequency semiconductor switch sections, a plurality of resistance elements which are connected between gate electrodes of the field effect transistors and the switching signal terminals for controlling the high frequency semiconductor switch sections, and a plurality of resistance elements which are connected between the drain electrodes and the source electrodes.

According to the eleventh aspect of the present invention, the potential transmission section in the fourth to 10th aspects includes a resistance element.

According to the twelfth aspect of the present invention, the potential transmission section in the fourth to 10th aspects includes a resistance element and an inductor element which are series-connected.

According to the thirteenth aspect of the present invention, the high frequency switch circuit in the first to 12th aspects is integrated in one semiconductor chip.

In other words, according to each aspect, the present invention comprises means for isolating in a DC state the potential of a high frequency semiconductor switch section (ON side) on a path which transmits a signal and the potential of a high frequency semiconductor switch section (OFF side) on a path which cuts off a signal, positively increasing a gate-source potential on the ON side, and negatively increasing a gate-source potential on the OFF side. The high frequency semiconductor switch section (ON side) on the path which transmits a signal and the high frequency semiconductor switch section (OFF side) on the path which cuts off a signal are isolated in the DC state. On the ON side, a voltage at the switching signal terminal becomes higher than voltages on the input side and output side of the high frequency semiconductor switch section, and their difference becomes large. As a result, the ON transmission resistance value decreases, reducing the transmission loss. On the OFF side, a voltage at the switching signal terminal becomes lower than voltages at the input terminal and output terminal, and their difference becomes large, increasing the OFF handling power. Since a DC potential is applied using a switching signal voltage, no external power supply is required. In short, signal transmission paths are isolated, and the voltage of a switching signal is exploited, positively increasing Vgs of an ON switch and negatively increasing Vgs of an OFF switch.

The high frequency switch circuit according to the present invention exhibits the following effects.

In the following description, the switching signal terminal is a control terminal, a voltage applied to the switching signal terminal is a control voltage, voltages on the input side and output side of the high frequency semiconductor switch section are an input/output voltage, "close" is "ON", and "open" is "OFF" for a high frequency semiconductor switch section which is closed upon application of a high potential to the switching signal terminal and opened upon application of a low potential.

As the first effect, the control voltage is much higher than the input/output voltage in a high frequency semiconductor switch section (ON side) on a path which transmits a high frequency signal, and the ON transmission resistance value can be decreased to reduce the transmission loss. This is because high frequency semiconductor switch sections are isolated from each other in the DC state, the input side or output side of the high frequency semiconductor switch section (ON side) is connected to the control terminal of the other high frequency semiconductor switch section (OFF side) via the potential transmission section, and a low potential applied to the control terminal is transmitted.

As the second effect, the control voltage is much lower than the input voltage in a high frequency semiconductor switch section (OFF side) on a path which cuts off a high frequency signal, and the OFF handling power can be increased. This is because high frequency semiconductor switch sections are isolated from each other in the DC state, the input side or output side of the high frequency semiconductor switch section (OFF side) is connected to the control terminal of the other high frequency semiconductor switch section (ON side) via the potential transmission section, and a high potential applied to the control terminal is transmitted.

A conventional circuit arrangement cannot attain these two effects at the same time. To the contrary, the present invention can achieve these two effects at the same time by, e.g., isolating high frequency semiconductor switch sections in the DC state. As for a high frequency semiconductor switch section which is opened upon application of a high potential to the switching signal terminal and closed upon application of a low potential, the voltage level in the above description is reversed.

Other objects, aspects, and advantages of the present invention will be apparent to those skilled in the art from the following detailed description taken in conjunction with the accompanying drawings, in which preferred examples complying with the principle of the present invention are described as embodiments.

BEST MODE FOR CARRYING OUT THE INVENTION

Figure 1:
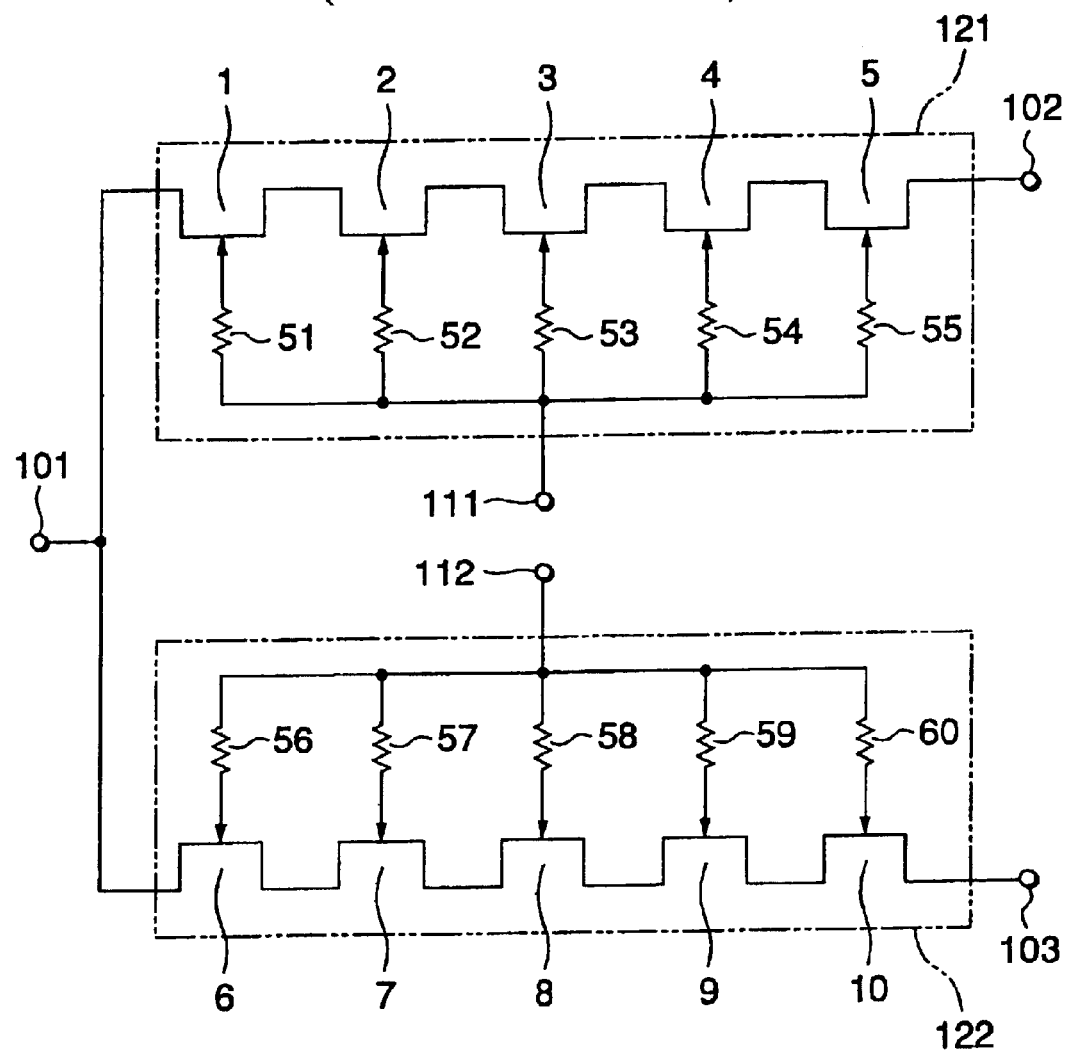
FIG. 1 is a circuit diagram showing the first prior art of a high frequency switch circuit.
Figure 2:
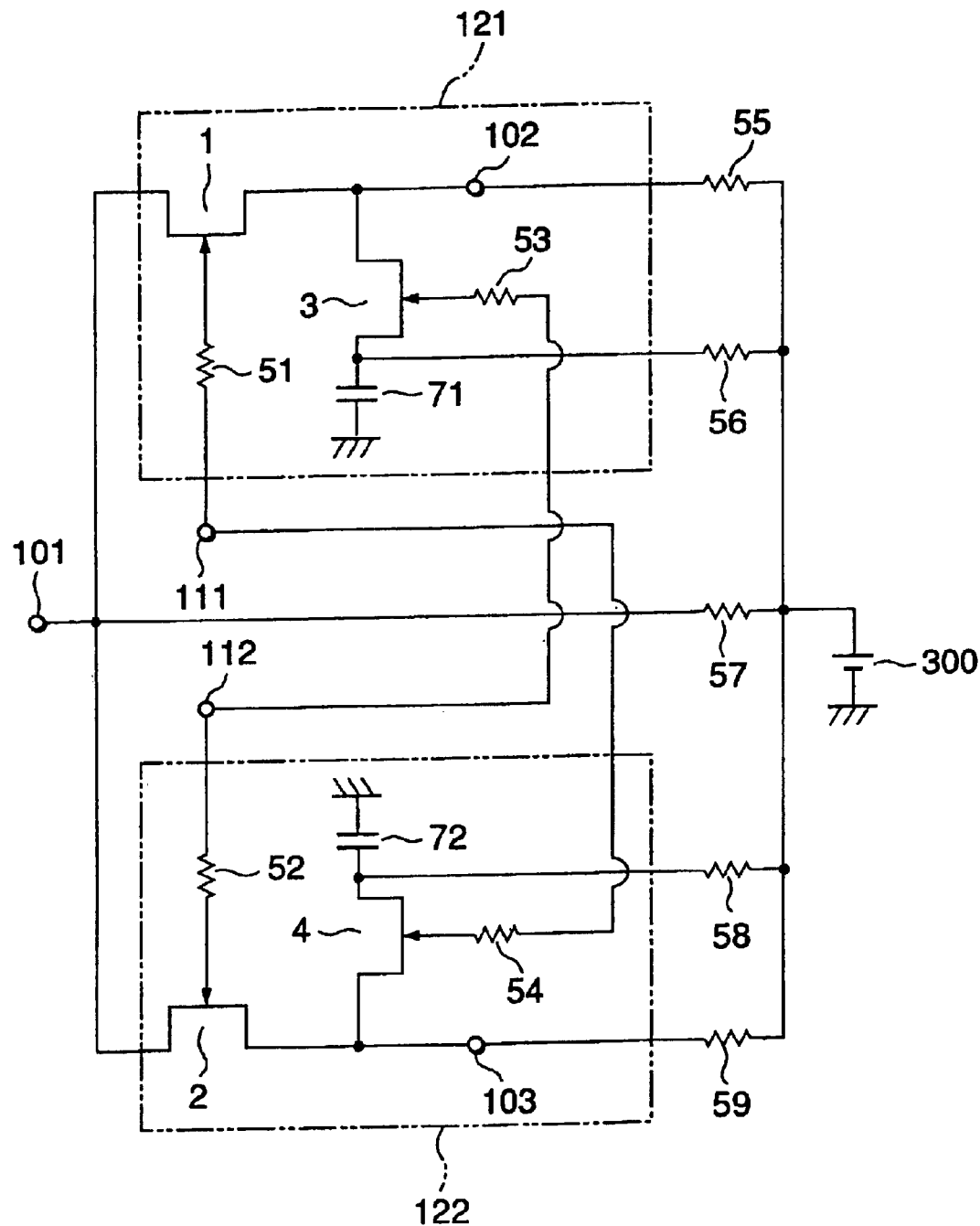
FIG. 2 is a circuit diagram showing the second prior art of a high frequency switch circuit.
Figure 3:
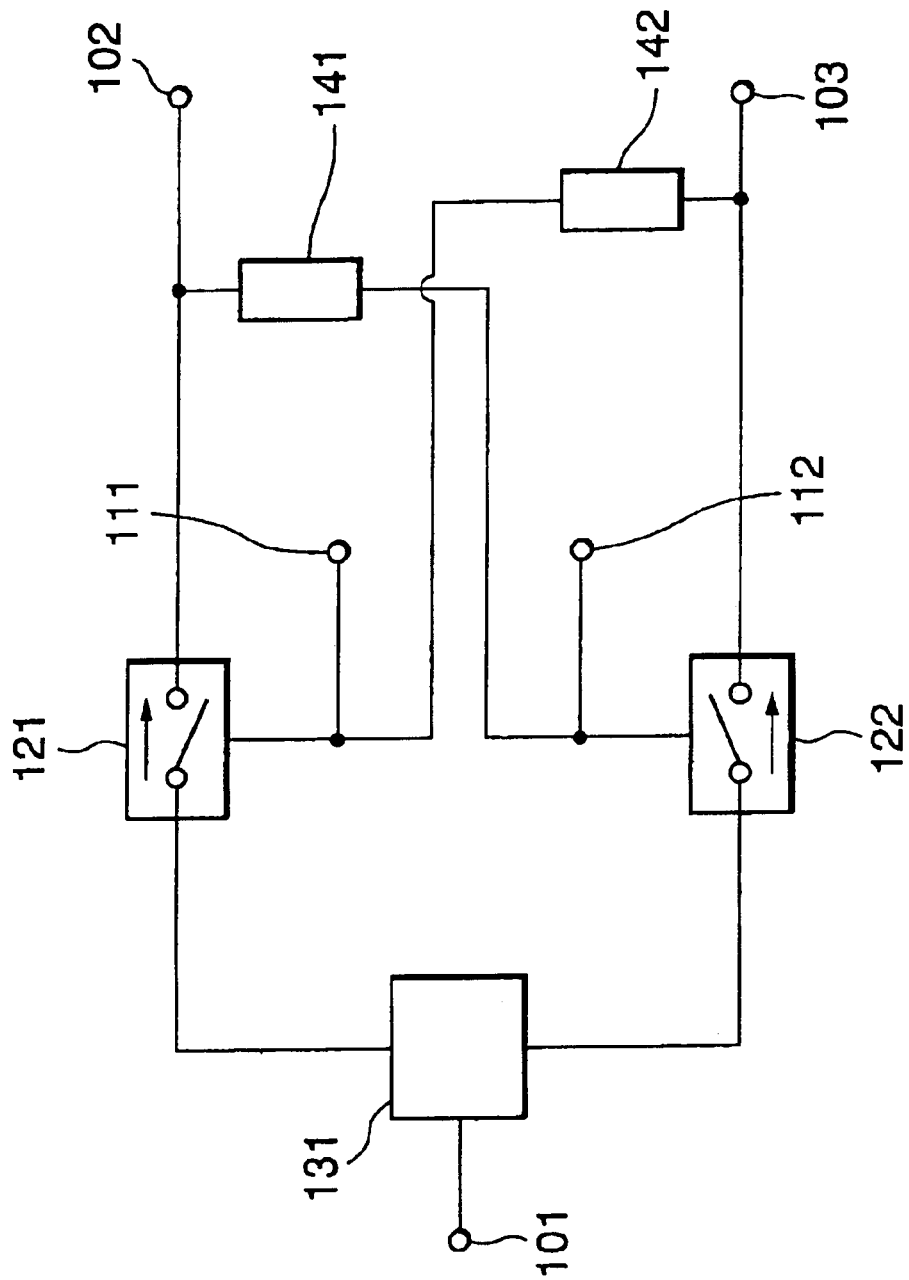
FIG. 3 is a circuit diagram showing the first embodiment of a high frequency switch circuit according to the present invention.

FIG. 3 is a circuit diagram showing the first embodiment of a high frequency switch circuit according to the present invention. The first embodiment will be explained with FIG. 3.

The high frequency switch circuit according to the first embodiment comprises high frequency terminals 101, 102, and 103 which input/output a high frequency signal, a high frequency semiconductor switch section 121 which switches between the high frequency terminals 101 and 102, a high frequency semiconductor switch section 122 which switches between the high frequency terminals 101 and 103, a switching signal terminal 111 which controls switching operation of the high frequency semiconductor switch section 121, a switching signal terminal 112 which controls switching operation of the high frequency semiconductor switch section 122, a DC potential isolating section 131 which is connected between the high frequency terminal 101 and the high frequency semiconductor switch sections 121 and 122 and isolates the high frequency semiconductor switch sections 121 and 122 in the DC state, a potential transmission section 141 which is connected between the switching signal terminal 112 and the high frequency terminal 102 and applies to the high frequency terminal 102 a DC potential applied to the switching signal terminal 112, and a potential transmission section 142 which is connected between the switching signal terminal 111 and the high frequency terminal 103 and applies to the high frequency terminal 103 a DC potential applied to the switching signal terminal 111.

FIG. 3 illustrates arrows in the blocks of the high frequency semiconductor switch sections 121 and 122. The proximal side of each arrow represents the input side of a high frequency signal, and the distal side represents the output side of the high frequency signal.

In the high frequency switch circuit according to the first embodiment, the output side of the high frequency semiconductor switch section 121 is connected to the high frequency terminal 102. The output side of the high frequency semiconductor switch section 122 is connected to the high frequency terminal 103. The input sides of the high frequency semiconductor switch sections 121 and 122 are connected to the high frequency terminal 101 via the DC potential isolating section 131 so as to prevent DC potentials at their input and output sides from being equal to each other. The control side of the high frequency semiconductor switch section 121 is connected to the switching signal terminal 111. The control side of the high frequency semiconductor switch section 122 is connected to the switching signal terminal 112. The potential transmission section 142 is connected to the switching signal terminal 111 in order to transmit to the high frequency terminal 103 a voltage applied to the switching signal terminal 111. The potential transmission section 141 is connected to the switching signal terminal 112 in order to transmit to the high frequency terminal 102 a voltage applied to the switching signal terminal 112.

Figure 4A:
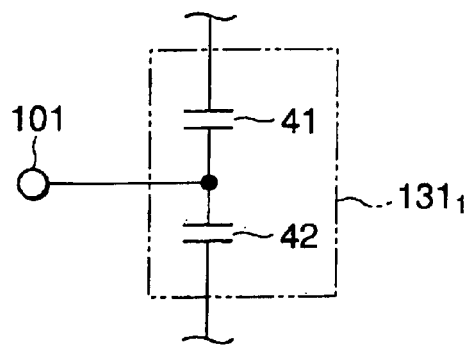
FIGS. 4A to 4E are circuit diagrams showing the first to fifth examples of a DC potential isolating section in the high frequency switch circuit according to the first embodiment, respectively.
Figure 4B:
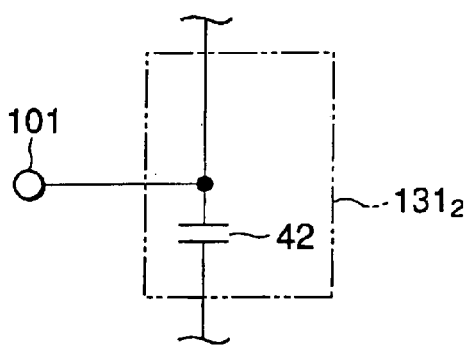
Figure 4C:
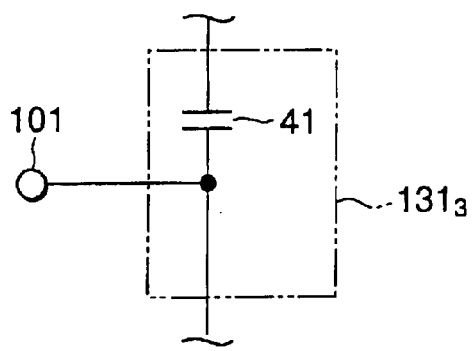

FIGS. 4A to 4C are circuit diagrams showing the first to third examples of the DC potential isolating section in the high frequency switch circuit according to the first embodiment. The first to third examples will be explained with reference to FIGS. 3 and 4A to 4C.

As shown in FIG. 4A, a DC potential isolating section $131_1$ in the first example is comprised of a capacitive element 41 connected between the high frequency terminal 101 and the input side of the high frequency semiconductor switch section 121, and a capacitive element 42 connected between the high frequency terminal 101 and the input side of the high frequency semiconductor switch section 122. As shown in FIG. 4B, a DC potential isolating section $131_2$ in the second example is comprised of a capacitive element 42 connected between the high frequency terminal 101 and the input side of the high frequency semiconductor switch section 122. As shown in FIG. 4C, a DC potential isolating section $131_3$ in the third example is comprised of a capacitive element 41 connected between the high frequency terminal 101 and the input side of the high frequency semiconductor switch section 121.

Figure 4D:
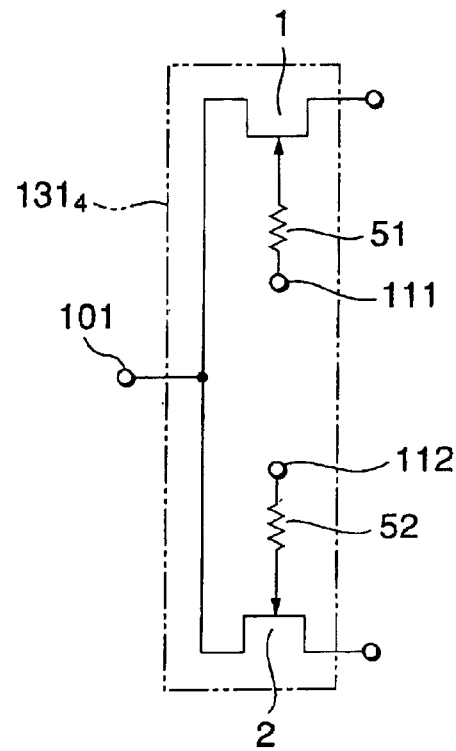
Figure 4E:
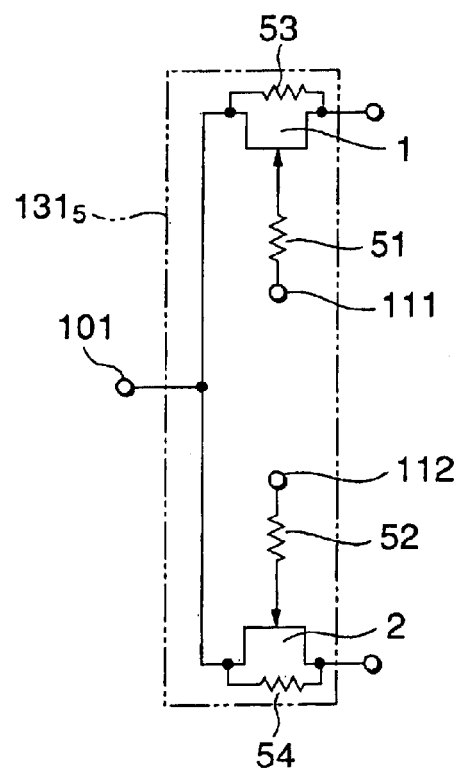

FIGS. 4D and 4E are circuit diagrams showing the fourth and fifth examples of the DC potential isolating section in the high frequency switch circuit according to the first embodiment. The fourth and fifth examples will be explained with reference to FIGS. 3, 4D, and 4E.

As shown in FIG. 4D, a DC potential isolating section $131_4$ in the fourth example comprises a field effect transistor 1 having drain and source electrodes connected between the high frequency terminal 101 and the high frequency semiconductor switch section 121, a field effect transistor 2 having drain and source electrodes connected between the high frequency terminal 101 and the high frequency semiconductor switch section 122, a resistance element 51 connected between the gate electrode of the field effect transistor 1 and the switching signal terminal 111, and a resistance element 52 connected between the gate electrode of the field effect transistor 2 and the switching signal terminal 112.

As shown in FIG. 4E, a DC potential isolating section $131_5$ in the fifth example comprises a resistance element 53 connected between the drain and source electrodes of the field effect transistor 1, and a resistance element 54 connected between the drain and source electrodes of the field effect transistor 2, in addition to the arrangement of the DC potential isolating section in the fourth example. The resistance elements 53 and 54 have a high resistance value of, e.g., several ten kΩ.

Figure 5A:
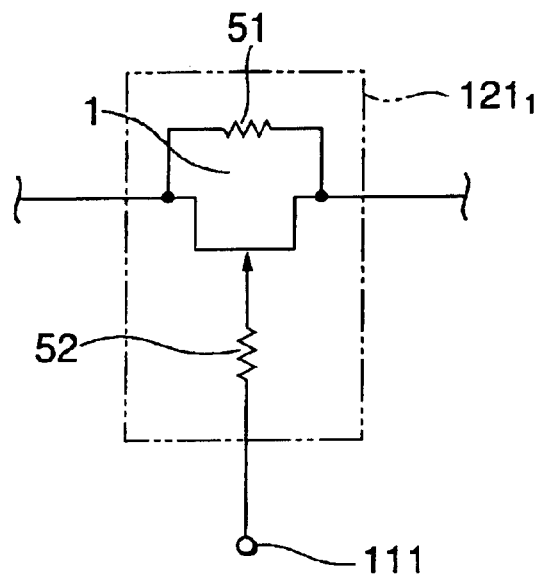
FIGS. 5A and 5B are circuit diagrams showing examples of a high frequency semiconductor switch section in the high frequency switch circuit according to the first embodiment, respectively.
Figure 5B:
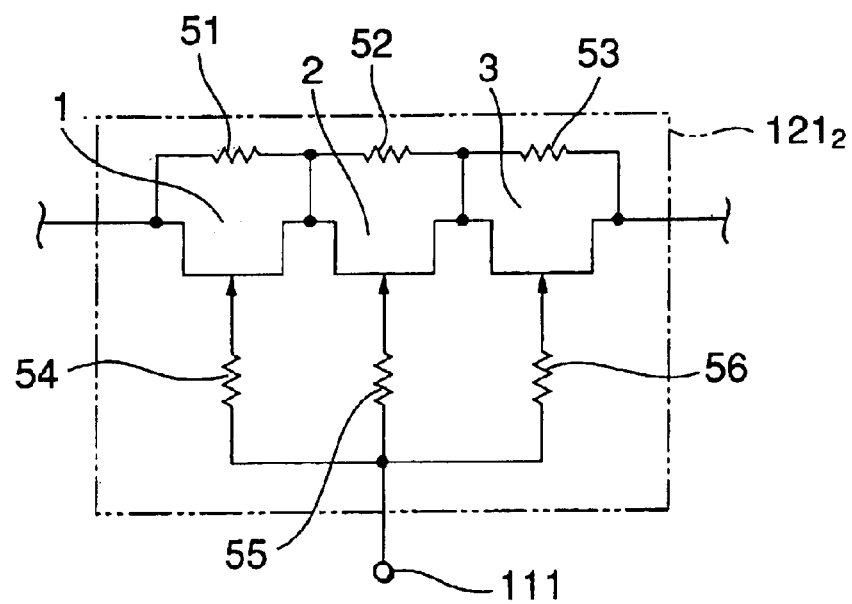

FIGS. 5A and 5B are circuit diagrams showing the first and second examples of the high frequency semiconductor switch section in the high frequency switch circuit according to the first embodiment. The first and second examples will be explained with reference to FIGS. 3, 5A, and 5B.

As shown in FIG. 5A, a high frequency semiconductor switch section $121_1$ in the first example comprises a field effect transistor 1 having drain and source electrodes connected between the high frequency terminals 101 and 102, a resistance element 52 connected between the gate electrode of the field effect transistor 1 and the switching signal terminal 111, and a resistance element 51 connected between the drain and source electrodes of the field effect transistor 1. The resistance element 51 is arranged to set potentials at the drain and source of the field effect transistor 1 equal to each other, and has a resistance value of, e.g., several kΩ or higher.

As shown in FIG. 5B, a high frequency semiconductor switch section $121_2$ in the second example comprises field effect transistors 1, 2, and 3 having drain and source electrodes series-connected between the high frequency terminals 101 and 102, resistance elements 54, 55, and 56 respectively connected between the gate electrodes of the field effect transistors 1, 2, and 3 and the switching signal terminal 111, and resistance elements 51, 52, and 53 respectively connected between the drain and source electrodes of the field effect transistors 1, 2, and 3. The resistance elements 51 to 53 are arranged to set potentials at the drains and sources of the field effect transistors 1 to 3 equal to each other, and have a resistance value of, e.g., several kΩ or higher.

The high frequency semiconductor switch section 122 in FIG. 3 also complies with the arrangements of the high frequency semiconductor switch sections $121_1$ and $121_2$ in FIGS. 5A and 5B. A single or three field effect transistors are connected in FIGS. 5A and 5B, but two or four or more field effect transistors may be connected.

Figure 6A:
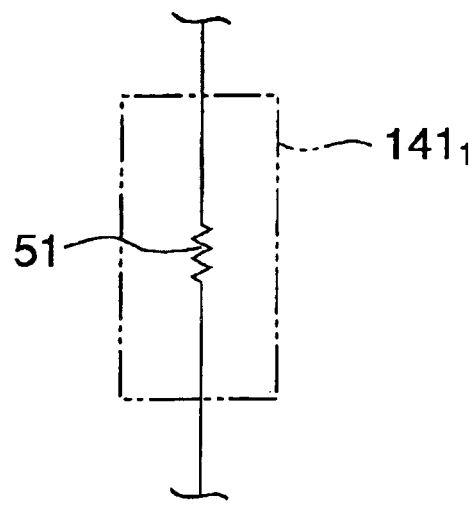
FIGS. 6A and 6B are circuit diagrams showing the first and second examples of a potential transmission section in the high frequency switch circuit according to the first embodiment, respectively.
Figure 6B:
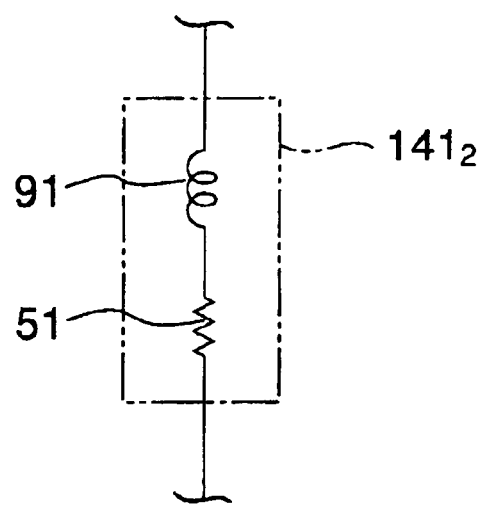

FIGS. 6A and 6B are circuit diagrams showing the first and second examples of the potential transmission section in the high frequency switch circuit according to the first embodiment. The first and second examples will be explained with reference to FIGS. 3, 6A, and 6B.

As shown in FIG. 6A, a potential transmission section $141_1$ in the first example comprises a resistance element 51. The resistance element 51 has a resistance value of, e.g., several ten kΩ or higher. As shown in FIG. 6B, a potential transmission section $141_2$ in the second example comprises a resistance element 51 and inductor element 91 which are series-connected to each other.

The potential transmission section 142 in FIG. 3 also complies with the arrangements of the potential transmission sections 141₁ and 141₂ in FIGS. 6A and 6B. The potential transmission section 141 is connected to only the output side of the high frequency semiconductor switch section 121 in FIG. 3, but may be connected to only the input side of the high frequency semiconductor switch section 121 or both the input and output sides of the high frequency semiconductor switch section 121. Similarly, the potential transmission section 142 is connected to only the output side of the high frequency semiconductor switch section 122 in FIG. 3, but may be connected to only the input side of the high frequency semiconductor switch section 122 or both the input and output sides of the high frequency semiconductor switch section 122.

The operation of the high frequency switch circuit according to the first embodiment will be described with reference to FIG. 3.

Assume that high level is input to the switching signal terminal 111, and low level is input to the switching signal terminal 112. At this time, the input and output sides of the high frequency semiconductor switch section 121 are connected to the switching signal terminal 112 via the potential transmission section 141, and the potential drops close to low level. The potential on the control side of the high frequency semiconductor switch section 121 becomes much higher than the potentials on the input and output sides. This sufficiently decreases the ON resistance of the high frequency semiconductor switch section 121, reducing the transmission loss.

In the DC state, the input and output sides of the high frequency semiconductor switch section 122 are disconnected from the input and output sides of the high frequency semiconductor switch section 121 by the DC potential isolating section 131. The input and output sides of the high frequency semiconductor switch section 122 can take values different from the potentials on the input and output sides of the high frequency semiconductor switch section 121. That is, the input and output sides of the high frequency semiconductor switch section 122 are connected to the switching signal terminal 111 via the potential transmission section 142, and the potential rises close to high level. The potential on the control side of the high frequency semiconductor switch section 122 becomes much lower than the potentials on the input and output sides of the high frequency semiconductor switch section 122. The high frequency semiconductor switch section 122 is therefore turned off. The input and output sides of the high frequency semiconductor switch section 122 become higher in potential than the input and output sides of the high frequency semiconductor switch section 121.

Letting Vn be the potential on the input and output sides of the high frequency semiconductor switch section 122, VL be low level, and VT be the threshold voltage of the field effect transistor which constitutes the high frequency semiconductor switch section 122, maximum power Pmax capable of maintaining the OFF state is given by $$P\max = 2\{n(Vn-VL+VT)\}2/Zo$$

(where n is the number of cascade connection stages of field effect transistors which constitute the high frequency semiconductor switch section 122, and Zo is the evaluation system impedance in the switch circuit.)

In the first embodiment, Vn can be set high. As is apparent from the above equation, Pmax becomes higher than that in a case wherein the high frequency semiconductor switch sections 121 and 122 are not isolated in the DC state. Reduction in transmission loss and an increase in handling power can be simultaneously achieved.

Figure 7:
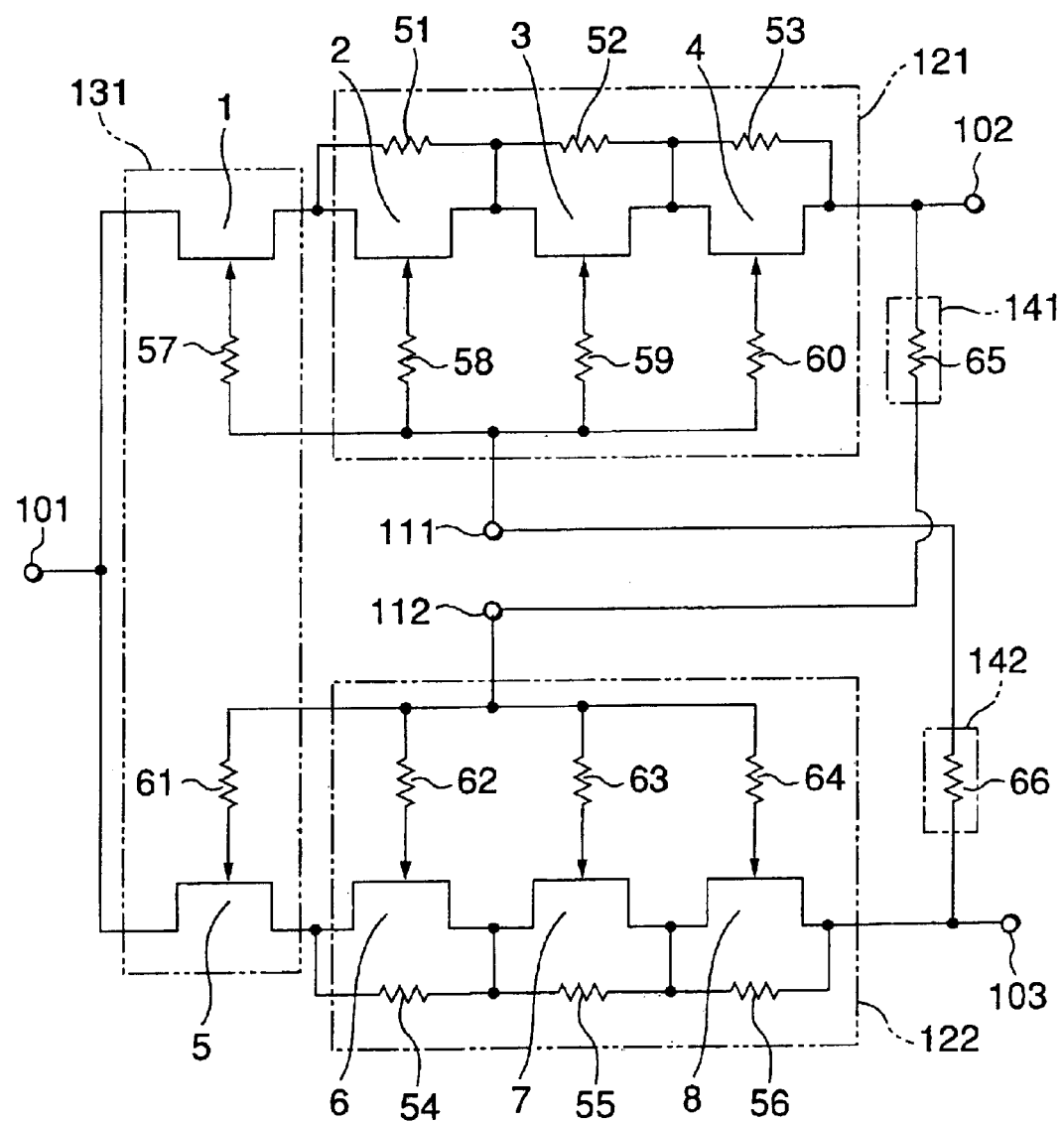
FIG. 7 is a circuit diagram showing the second embodiment of a high frequency switch circuit according to the present invention.

FIG. 7 is a circuit diagram showing the second embodiment of a high frequency switch circuit according to the present invention. The second embodiment will be explained with reference to FIG. 7.

In the high frequency switch circuit according to the second embodiment, DC potential isolating section 131 adopts the arrangement shown in FIG. 4D, high frequency semiconductor switch sections 121 and 122 adopt the arrangement shown in FIG. 5B, and potential transmission sections 141 and 142 adopt the arrangement shown in FIG. 6A. The high frequency switch circuit according to the second embodiment exhibits the same operations and effects as those of the high frequency switch circuit according to the first embodiment.

Figure 8:
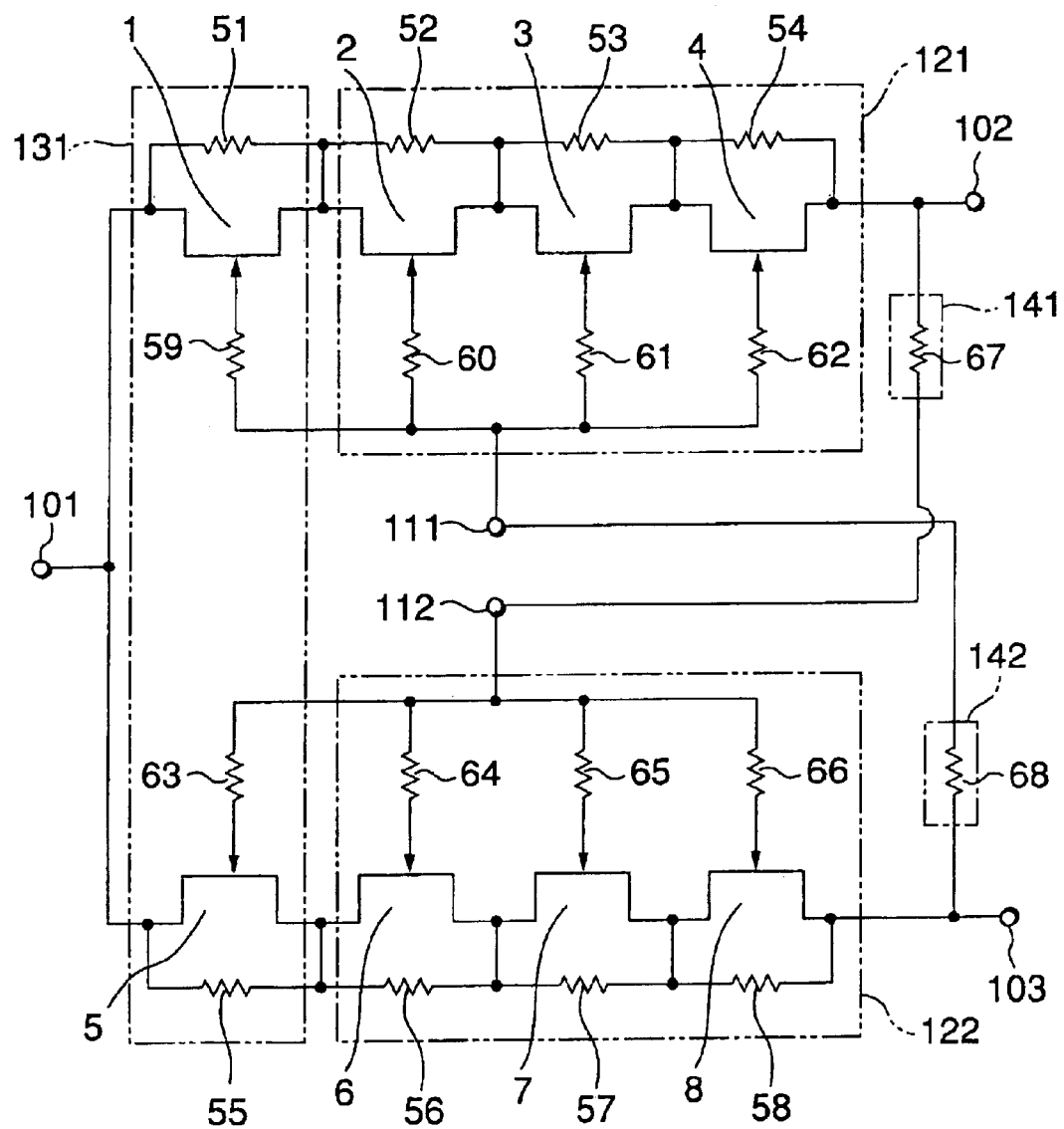
FIG. 8 is a circuit diagram showing the third embodiment of a high frequency switch circuit according to the present invention.

FIG. 8 is a circuit diagram showing the third embodiment of a high frequency switch circuit according to the present invention. The third embodiment will be explained with reference to FIG. 8.

In the high frequency switch circuit according to the third embodiment, DC potential isolating section 131 adopts the arrangement shown in FIG. 4E, high frequency semiconductor switch sections 121 and 122 adopt the arrangement shown in FIG. 5B, and potential transmission sections 141 and 142 adopt the arrangement shown in FIG. 6A. The high frequency switch circuit according to the third embodiment exhibits the same operations and effects as those of the high frequency switch circuit according to the first embodiment.

Figure 9:
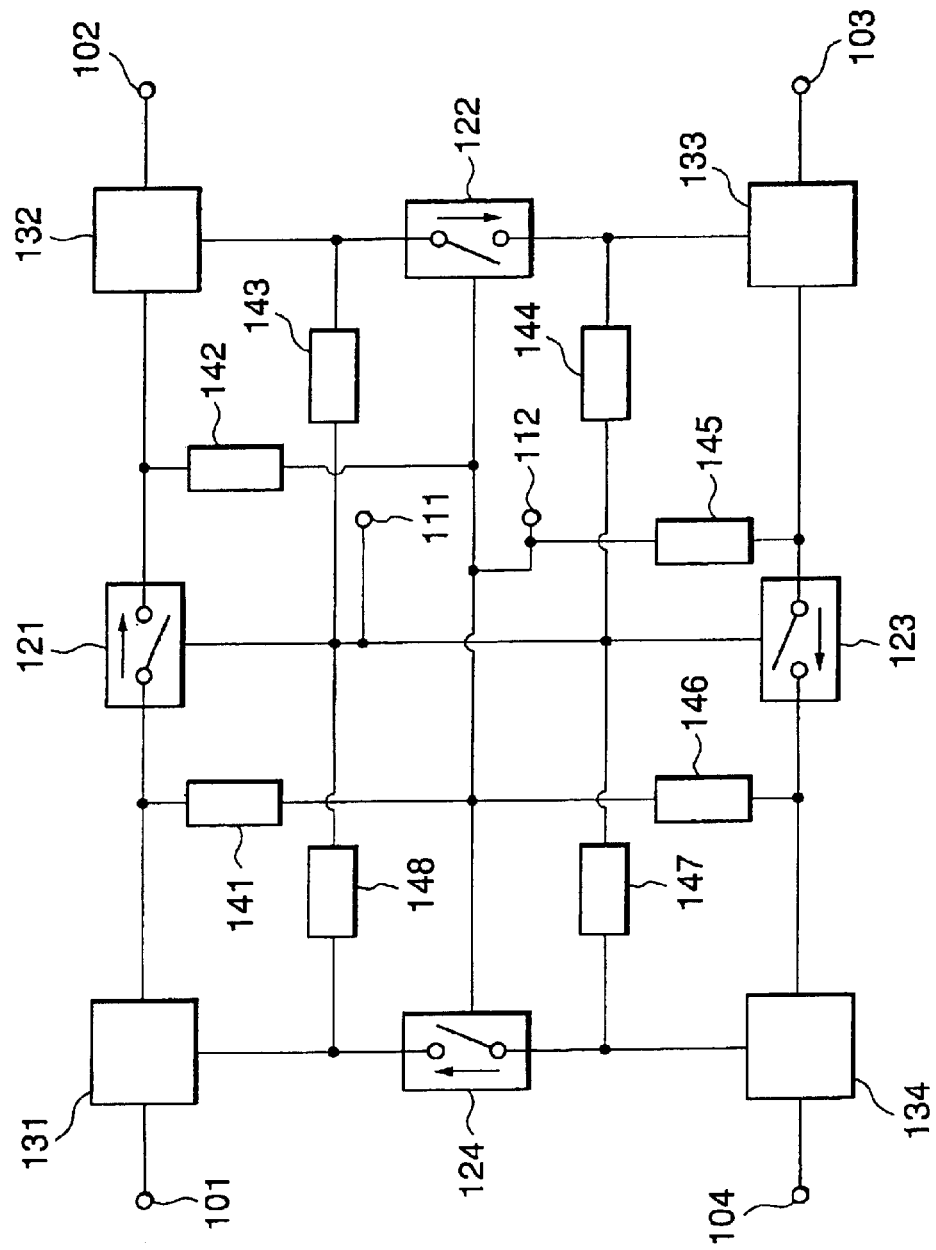
FIG. 9 is a circuit diagram showing the fourth embodiment of a high frequency switch circuit according to the present invention.
Figure 10A:
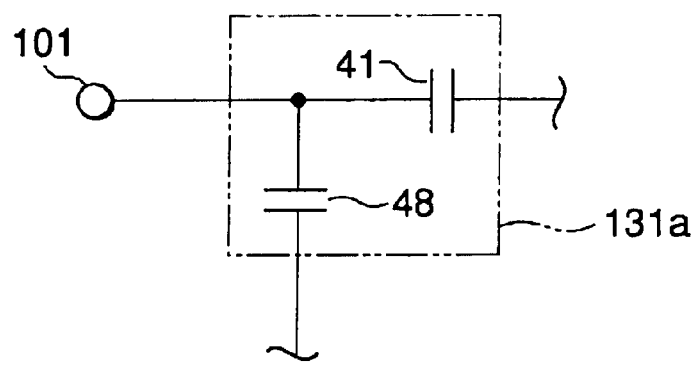
FIGS. 10A to 10D are circuit diagrams showing the first example of the first to fourth DC potential isolating sections in the high frequency switch circuit according to the fourth embodiment, respectively.
Figure 10B:
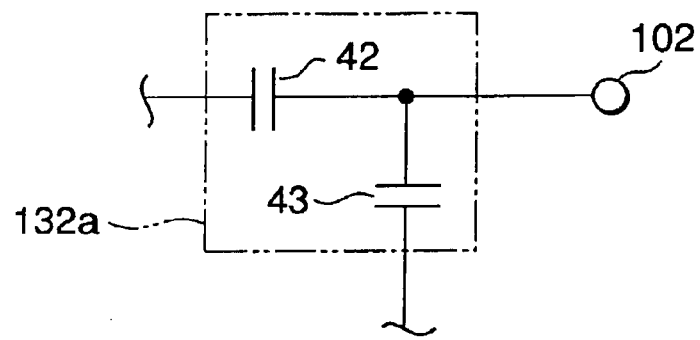
Figure 10C:
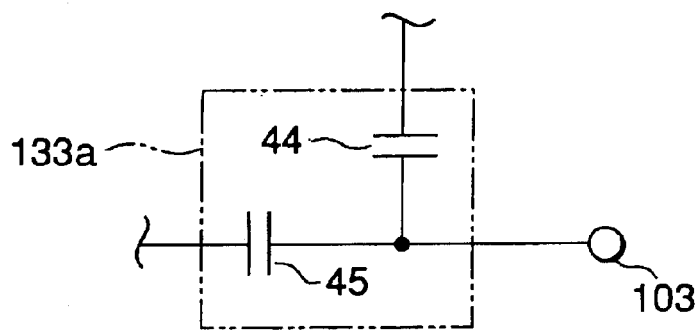
Figure 10D:
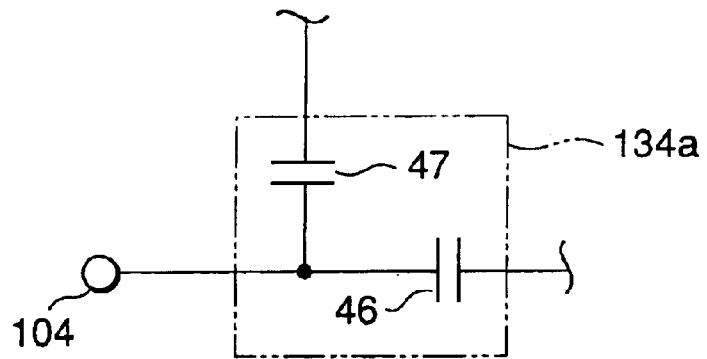
Figure 11A:
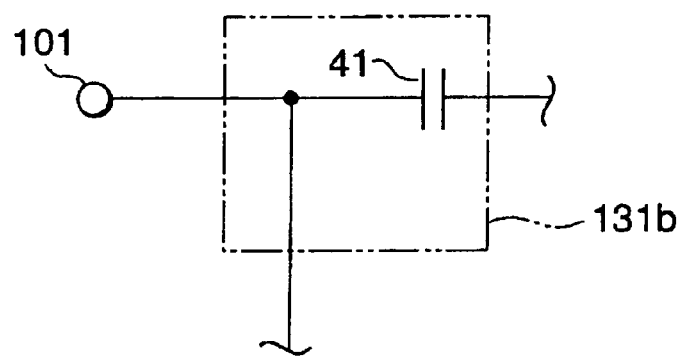
FIGS. 11A to 11D are circuit diagrams showing the second example of the first to fourth DC potential isolating sections in the high frequency switch circuit according to the fourth embodiment, respectively.
Figure 11B:
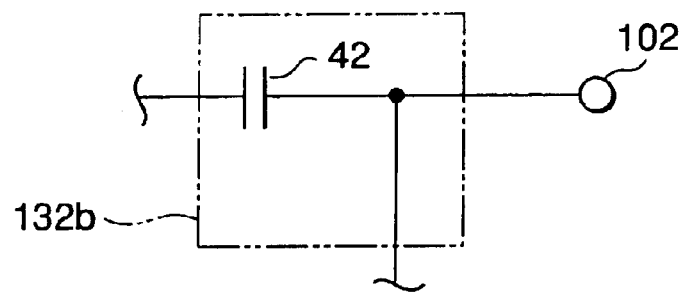
Figure 11C:
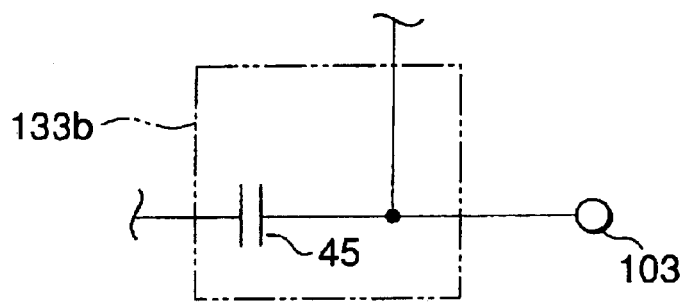
Figure 11D:
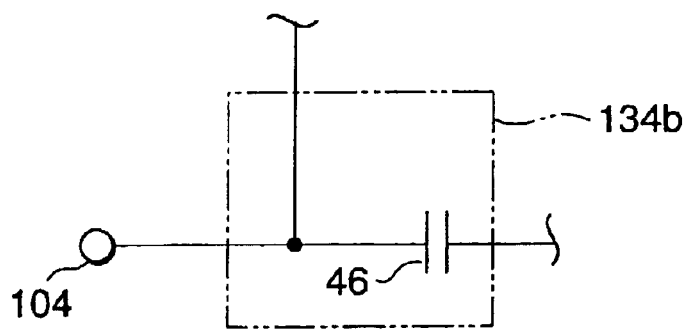
Figure 12A:
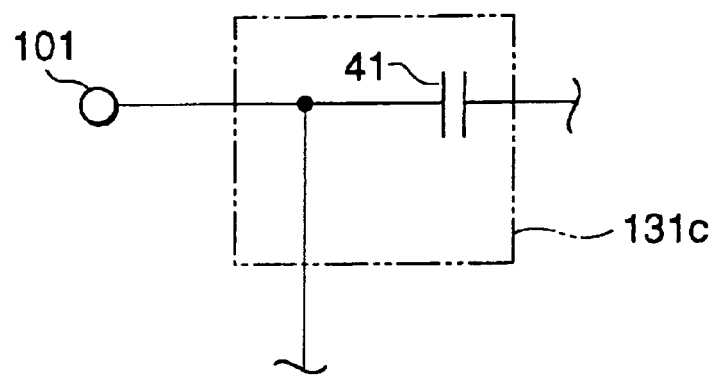
FIGS. 12A to 12D are circuit diagrams showing the third example of the first to fourth DC potential isolating sections in the high frequency switch circuit according to the fourth embodiment, respectively.
Figure 12B:
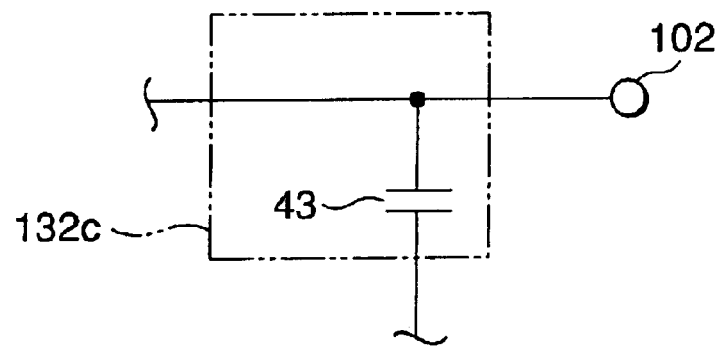
Figure 12C:
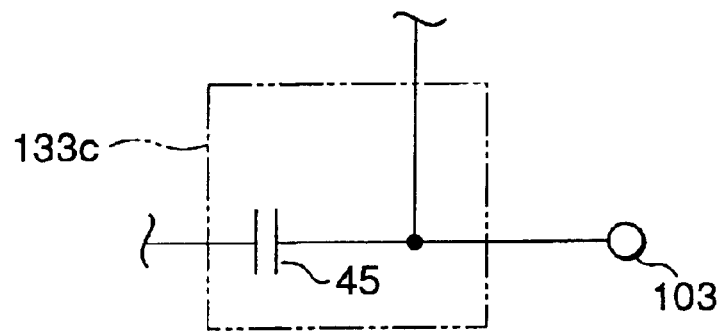
Figure 12D:
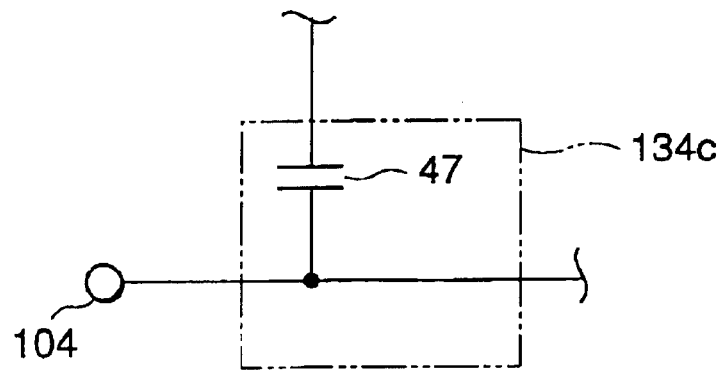
Figure 13A:
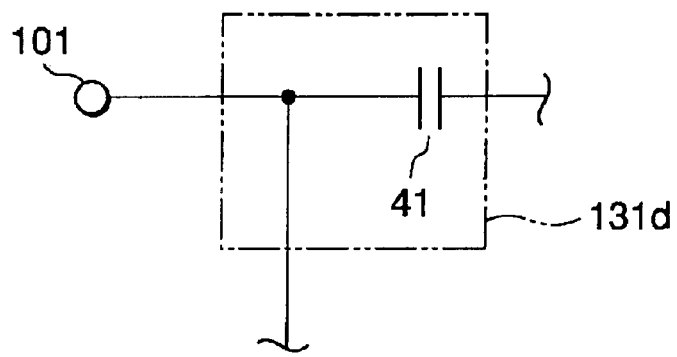
FIGS. 13A to 13D are circuit diagrams showing the fourth example of the first to fourth DC potential isolating sections in the high frequency switch circuit according to the fourth embodiment, respectively.
Figure 13B:
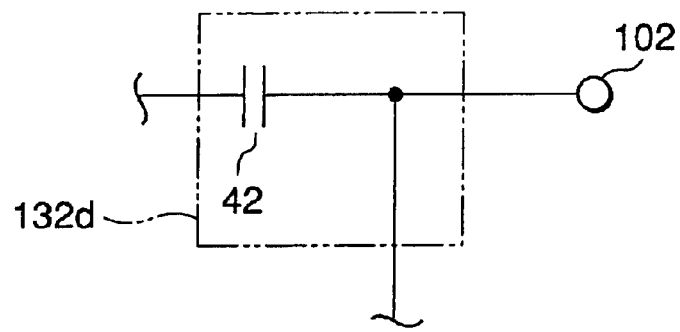
Figure 13C:
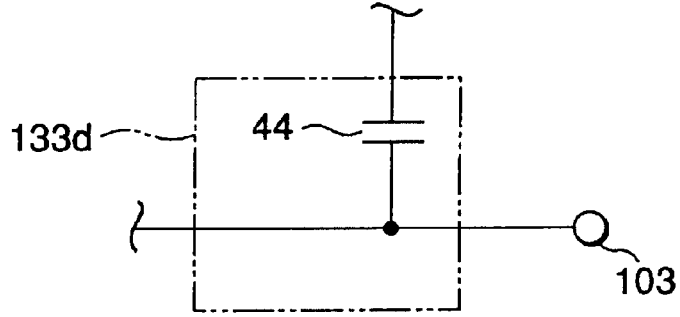
Figure 13D:
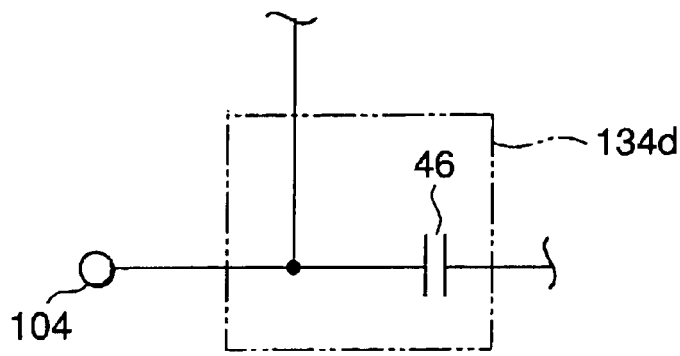
Figure 14A:
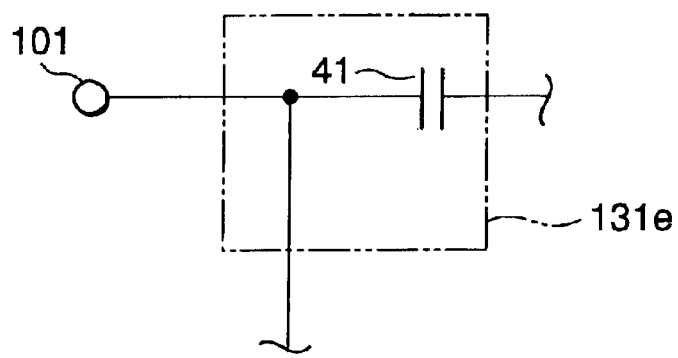
FIGS. 14A to 14D are circuit diagrams showing the fifth example of the first to fourth DC potential isolating sections in the high frequency switch circuit according to the fourth embodiment, respectively.
Figure 14B:
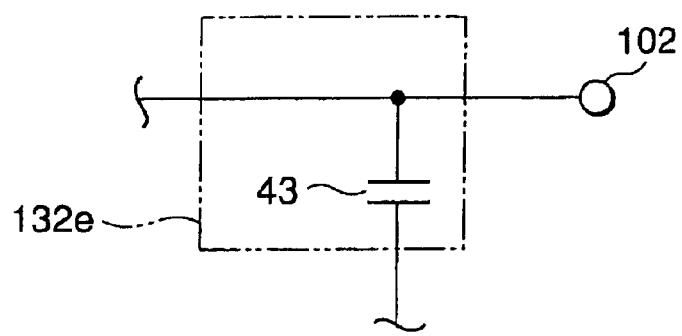
Figure 14C:
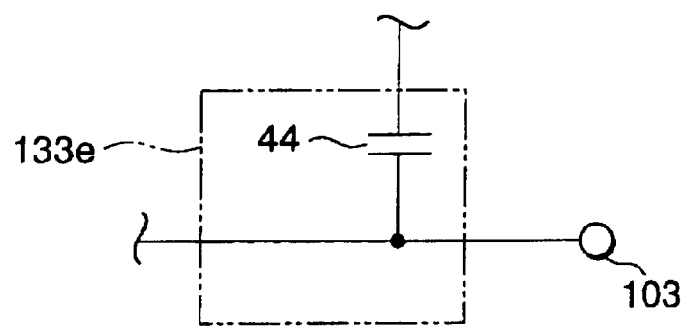
Figure 14D:
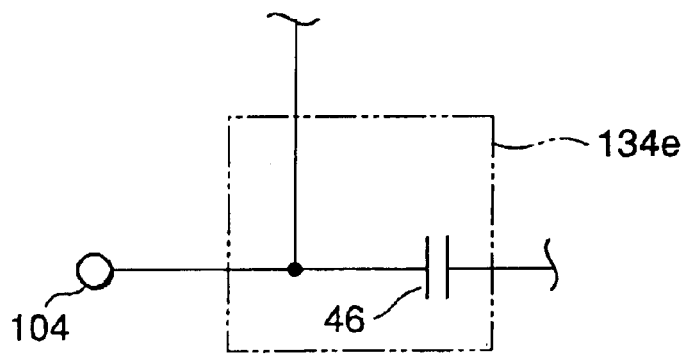

FIG. 9 is a circuit diagram showing the fourth embodiment of a high frequency switch circuit according to the present invention. The fourth embodiment will be explained with FIG. 9.

The high frequency switch circuit according to the fourth embodiment comprises high frequency terminals 101 to 104 which input/output a high frequency signal, a high frequency switch section 121 which switches between the high frequency terminals 101 and 102, a high frequency switch section 122 which switches between the high frequency terminals 102 and 103, a high frequency semiconductor switch section 123 which switches between the high frequency terminals 103 and 104, a high frequency semiconductor switch section 124 which switches between the high frequency terminals 104 and 101, a switching signal terminal 111 which controls switching operation of the high frequency semiconductor switch sections 121 and 123, a switching signal terminal 112 which controls switching operation of the high frequency semiconductor switch sections 122 and 124, a DC potential isolating section 131 which is connected between the high frequency terminal 131 and the high frequency semiconductor switch sections 124 and 121 and isolates the high frequency semiconductor switch section 124 and the high frequency switch section 121 in the DC state, a DC potential isolating section 132 which is connected between the high frequency terminal 102 and the high frequency semiconductor switch sections 121 and 122 and isolates the high frequency semiconductor switch sections 121 and 122 in the DC state, a DC potential isolating section 133 which is connected between the high frequency terminal 103 and the high frequency semiconductor switch sections 122 and 123 and isolates the high frequency semiconductor switch sections 122 and 123 in the DC state, a DC potential isolating section 134 which is connected between the high frequency terminal 104 and the high frequency semiconductor switch sections 123 and 124 and isolates the high frequency semiconductor switch sections 123 and 124 in the DC state, a potential transmission section 141 which is connected between the switching signal terminal 112 and the input side of the high frequency semiconductor switch section 121 and applies to the input side a DC potential applied to the switching signal terminal 112, a potential transmission section 142 which is connected between the switching signal terminal 112 and the output side of the high frequency semiconductor switch section 121 and applies to the output side a DC potential applied to the switching signal terminal 112, a potential transmission section 143 which is connected between the switching signal terminal 111 and the input side of the high frequency semiconductor switch section 122 and applies to the input side a DC potential applied to the switching signal terminal 111, a potential transmission section 144 which is connected between the switching signal terminal 111 and the output side of the high frequency semiconductor switch section 122 and applies to the output side a DC potential applied to the switching signal terminal 111, a potential transmission section 145 which is connected between the switching signal terminal 112 and the input side of the high frequency semiconductor switch section 123 and applies to the input side a DC potential applied to the switching signal terminal 112, a potential transmission section 146 which is connected between the switching signal terminal 112 and the output side of the high frequency semiconductor switch section 123 and applies to the output side a DC potential applied to the switching signal terminal 112, a potential transmission section 147 which is connected between the switching signal terminal 111 and the input side of the high frequency semiconductor switch section 124 and applies to the input side a DC potential applied to the switching signal terminal 111, and a potential transmission section 148 which is connected between the switching signal terminal 111 and the output side of the high frequency semiconductor switch section 124 and applies to the output side a DC potential applied to the switching signal terminal 111.

FIG. 9 illustrates arrows in the blocks of the high frequency semiconductor switch sections 121 to 124. The proximal side of each arrow represents the input side of a high frequency signal, and the distal side represents the output side of the high frequency signal.

In the high frequency switch circuit according to the fourth embodiment, the high frequency terminal 101 is connected to the DC potential isolating section 131, the high frequency terminal 102 is connected to the DC potential isolating section 132, the high frequency terminal 103 is connected to the DC potential isolating section 133, and the high frequency terminal 104 is connected to the DC potential isolating section 134. Of the high frequency semiconductor switch sections 121 to 124, the input side of the high frequency semiconductor switch section 121 is connected to the DC potential isolating section 131, and the output side of the section 121 is connected to the DC potential isolating section 132. The input side of the high frequency semiconductor switch section 122 is connected to the DC potential isolating section 132, and the output side of the section 122 is connected to the DC potential isolating section 133. The input side of the high frequency semiconductor switch section 123 is connected to the DC potential isolating section 133, and the output side of the section 123 is connected to the DC potential isolating section 134. The input side of the high frequency semiconductor switch section 124 is connected to the DC potential isolating section 134, and the output side of the section 124 is connected to the DC potential isolating section 131. The control sides of the high frequency switches 121 and 123 are connected to the switching signal terminal 111, and the control sides of the high frequency switches 122 and 124 are connected to the switching signal terminal 112. In order to transmit a control voltage input to the switching signal terminal 111 to the high frequency semiconductor switch sections 122 and 124, the potential transmission section 143 is connected to the input side of the high frequency semiconductor switch section 122, the potential transmission section 144 is connected to the output side of the high frequency semiconductor switch section 122, the potential transmission section 147 is connected to the input side of the high frequency semiconductor switch section 124, and the potential transmission section 148 is connected to the output side of the high frequency semiconductor switch section 124. In order to transmit a control voltage input to the switching signal terminal 112 to the high frequency semiconductor switch sections 121 and 123, the potential transmission section 141 is connected to the input side of the high frequency semiconductor switch section 121, the potential transmission section 142 is connected to the output side of the high frequency semiconductor switch section 121, the potential transmission section 145 is connected to the input side of the high frequency semiconductor switch section 123, and the potential transmission section 146 is connected to the output side of the high frequency semiconductor switch section 123.

FIGS. 10A to 10D are circuit diagrams showing the first example of the DC potential isolating section in the high frequency switch circuit according to the fourth embodiment. The first example will be explained with reference to FIGS. 9 and 10A to 10D.

As shown in FIGS. 10A to 10D, a DC potential isolating section 131a is comprised of a capacitive element 48 connected between the high frequency terminal 101 and the high frequency semiconductor switch section 124, and a capacitive element 41 connected between the high frequency terminal 101 and the high frequency semiconductor switch section 121. A DC potential isolating section 132a is comprised of a capacitive element 42 connected between the high frequency terminal 102 and the high frequency semiconductor switch section 121, and a capacitive element 43 connected between the high frequency terminal 102 and the high frequency semiconductor switch section 122. A DC potential isolating section 133a is comprised of a capacitive element 44 connected between the high frequency terminal 103 and the high frequency semiconductor switch section 122, and a capacitive element 45 connected between the high frequency terminal 101 and the high frequency semiconductor switch section 123. A DC potential isolating section 134a is comprised of a capacitive element 46 connected between the high frequency terminal 104 and the high frequency semiconductor switch section 123, and a capacitive element 47 connected between the high frequency terminal 104 and the high frequency semiconductor switch section 124.

FIGS. 11A to 11D are circuit diagrams showing the second example of the DC potential isolating section in the high frequency switch circuit according to the fourth embodiment. The second example will be explained with reference to FIGS. 9 and 11A to 11D.

As shown in FIGS. 11A to 11D, a DC potential isolating section 131b is comprised of a capacitive element 41 connected between the high frequency terminal 101 and the high frequency semiconductor switch section 121. A DC potential isolating section 132b is comprised of a capacitive element 42 connected between the high frequency terminal 102 and the high frequency semiconductor switch section

121. A DC potential isolating section 133*b* is comprised of a capacitive element 45 connected between the high frequency terminal 101 and the high frequency semiconductor switch section 123. A DC potential isolating section 134*b* is comprised of a capacitive element 46 connected between the high frequency terminal 104 and the high frequency semiconductor switch section 123.

FIGS. 12A to 12D are circuit diagrams showing the third example of the DC potential isolating section in the high frequency switch circuit according to the fourth embodiment. The third example will be explained with reference to FIGS. 9 and 12A to 12D.

As shown in FIGS. 12A to 12D, a DC potential isolating section 131*c* is comprised of a capacitive element 41 connected between the high frequency terminal 101 and the high frequency semiconductor switch section 121. A DC potential isolating section 132*c* is comprised of a capacitive element 43 connected between the high frequency terminal 102 and the high frequency semiconductor switch section 122. A DC potential isolating section 133*c* is comprised of a capacitive element 45 connected between the high frequency terminal 101 and the high frequency semiconductor switch section 123. A DC potential isolating section 134*c* is comprised of a capacitive element 47 connected between the high frequency terminal 104 and the high frequency semiconductor switch section 124.

FIGS. 13A to 13D are circuit diagrams showing the fourth example of the DC potential isolating section in the high frequency switch circuit according to the fourth embodiment. The fourth example will be explained with reference to FIGS. 9 and 13A to 13D.

As shown in FIGS. 13A to 13D, a DC potential isolating section 131*d* is comprised of a capacitive element 41 connected between the high frequency terminal 101 and the high frequency semiconductor switch section 121. A DC potential isolating section 132*d* is comprised of a capacitive element 42 connected between the high frequency terminal 102 and the high frequency semiconductor switch section 121. A DC potential isolating section 133*d* is comprised of a capacitive element 44 connected between the high frequency terminal 103 and the high frequency semiconductor switch section 122. A DC potential isolating section 134*d* is comprised of a capacitive element 46 connected between the high frequency terminal 104 and the high frequency semiconductor switch section 123.

FIGS. 14A to 14D are circuit diagrams showing the fifth example of the DC potential isolating section in the high frequency switch circuit according to the fourth embodiment. The fifth example will be explained with reference to FIGS. 9 and 14A to 14D.

As shown in FIGS. 14A to 14D, a DC potential isolating section 131*e* is comprised of a capacitive element 41 connected between the high frequency terminal 101 and the high frequency semiconductor switch section 121. A DC potential isolating section 132*e* is comprised of a capacitive element 43 connected between the high frequency terminal 102 and the high frequency semiconductor switch section 122. A DC potential isolating section 133*e* is comprised of a capacitive element 44 connected between the high frequency terminal 103 and the high frequency semiconductor switch section 122. A DC potential isolating section 134*e* is comprised of a capacitive element 46 connected between the high frequency terminal 104 and the high frequency semiconductor switch section 123.

The DC potential isolating sections 131 to 134 in the high frequency switch circuit according to the fourth embodiment may adopt the arrangements shown in FIGS. 4D and 4E. The high frequency semiconductor switch sections 121 to 124 in the high frequency switch circuit according to the fourth embodiment may adopt the arrangements shown in FIGS. 5A and 5B. The potential transmission sections 141 to 148 in the high frequency switch circuit according to the fourth embodiment may adopt the arrangements shown in FIGS. 6A and 6B. The high frequency switch circuit according to the fourth embodiment exhibits the same operations and effects as those of the high frequency switch circuit according to the first embodiment.

Figure 15:
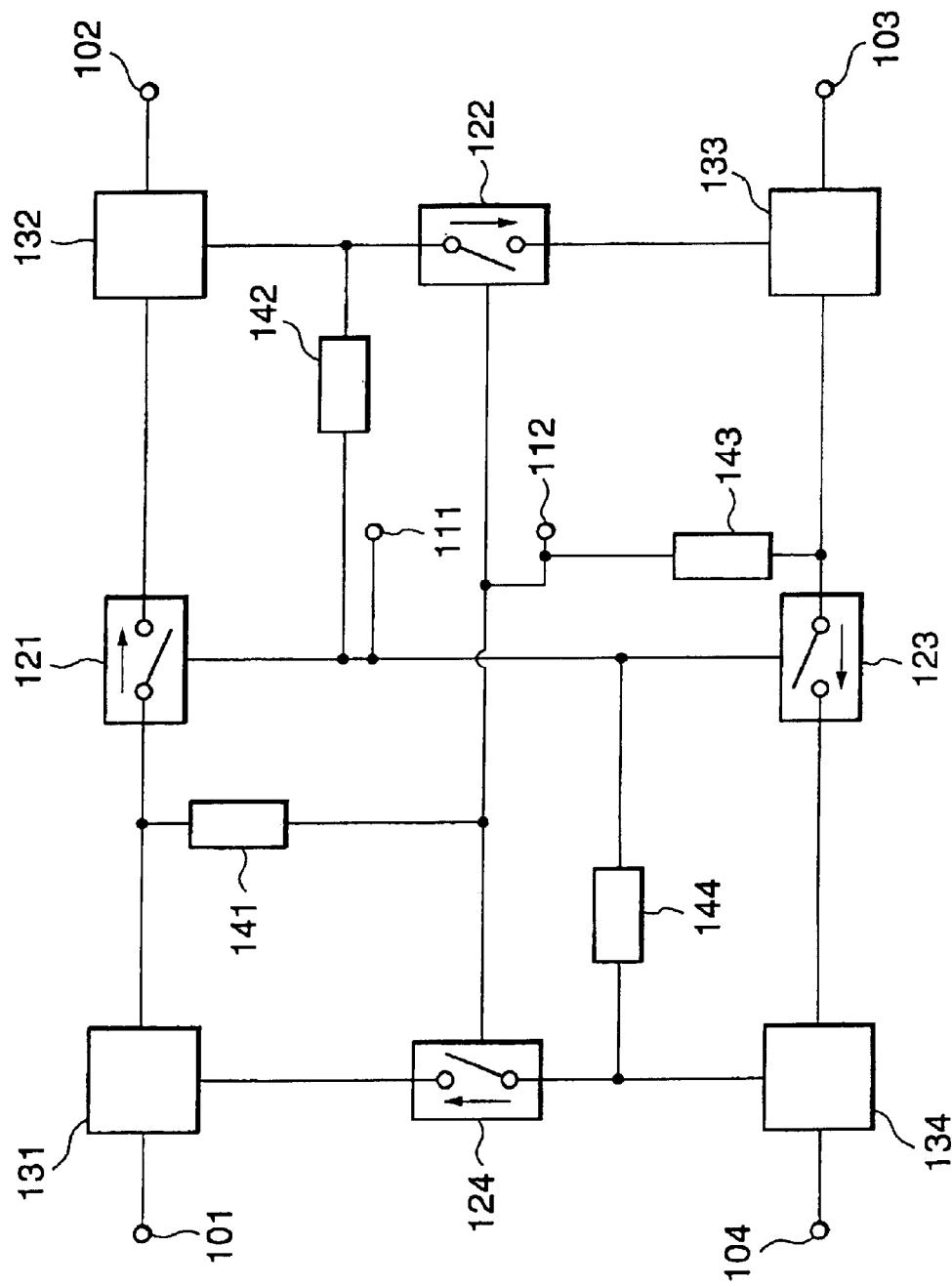
FIG. 15 is a circuit diagram showing the fifth embodiment of a high frequency switch circuit according to the present invention.

FIG. 15 is a circuit diagram showing the fifth embodiment of a high frequency switch circuit according to the present invention. The fifth embodiment will be explained with reference to FIG. 15.

The high frequency switch circuit according to the fifth embodiment is different from the fourth embodiment in that this high frequency switch circuit comprises a potential transmission section 141 which is connected between a switching signal terminal 112 and the input side of a high frequency semiconductor switch section 121 and applies to the input side a DC potential applied to the switching signal terminal 112, a potential transmission section 142 which is connected between a switching signal terminal 111 and the input side of a high frequency semiconductor switch section 122 and applies to the input side a DC potential applied to the switching signal terminal 111, a potential transmission section 143 which is connected between the switching signal terminal 112 and the input side of a high frequency semiconductor switch section 123 and applies to the input side a DC potential applied to the switching signal terminal 112, and a potential transmission section 144 which is connected between the switching signal terminal 111 and the input side of a high frequency semiconductor switch section 124 and applies to the input side a DC potential applied to the switching signal terminal 111.

DC potential isolating sections 131 to 134 in the high frequency switch circuit according to the fifth embodiment may adopt the arrangements shown in FIGS. 10A to 14D, 4D, and 4E. The high frequency semiconductor switch sections 121 to 124 in the high frequency switch circuit according to the fifth embodiment may adopt the arrangements shown in FIGS. 5A and 5B. The potential transmission sections 141 to 144 in the high frequency switch circuit according to the fifth embodiment may adopt the arrangements shown in FIGS. 6A and 6B. The high frequency switch circuit according to the fifth embodiment exhibits the same operations and effects as those of the high frequency switch circuit according to the fourth embodiment.

Figure 16:
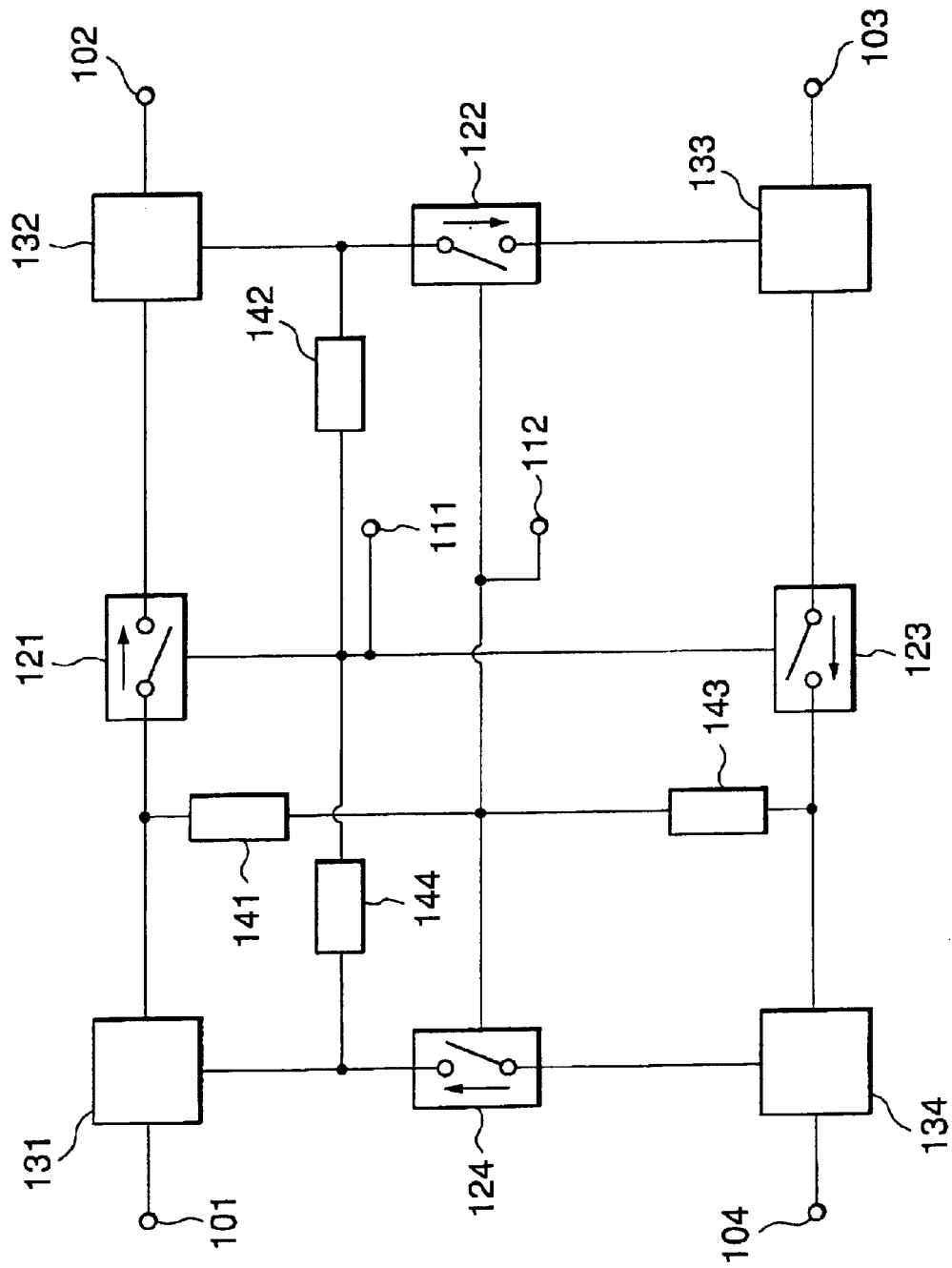
FIG. 16 is a circuit diagram showing the sixth embodiment of a high frequency switch circuit according to the present invention.

FIG. 16 is a circuit diagram showing the sixth embodiment of a high frequency switch circuit according to the present invention. The sixth embodiment will be explained with reference to FIG. 16.

The high frequency switch circuit according to the sixth embodiment is different from the fourth embodiment in that this high frequency switch circuit comprises a potential transmission section 141 which is connected between a switching signal terminal 112 and the input side of a high frequency switch section 121 and applies to the input side a DC potential applied to the switching signal terminal 112, a potential transmission section 142 which is connected between a switching signal terminal 111 and the input side of a high frequency semiconductor switch section 122 and applies to the input side a DC potential applied to the switching signal terminal 111, a potential transmission section 143 which is connected between the switching signal terminal 112 and the output side of a high frequency semiconductor switch section 123 and applies to the output side a DC potential applied to the switching signal terminal 112, and a potential transmission section 148 which is connected between the switching signal terminal 111 and the output side of a high frequency semiconductor switch section 124 and applies to the output side a DC potential applied to the switching signal terminal 111.

DC potential isolating sections 131 to 134 in the high frequency switch circuit according to the sixth embodiment may adopt the arrangements shown in FIGS. 10A to 14D, 4D, and 4E. The high frequency semiconductor switch sections 121 to 124 in the high frequency switch circuit according to the sixth embodiment may adopt the arrangements shown in FIGS. 5A and 5B. The potential transmission sections 141 to 144 in the high frequency switch circuit according to the sixth embodiment may adopt the arrangements shown in FIGS. 6A and 6B. The high frequency switch circuit according to the sixth embodiment exhibits the same operations and effects as those of the high frequency switch circuit according to the fourth embodiment.

Figure 17:
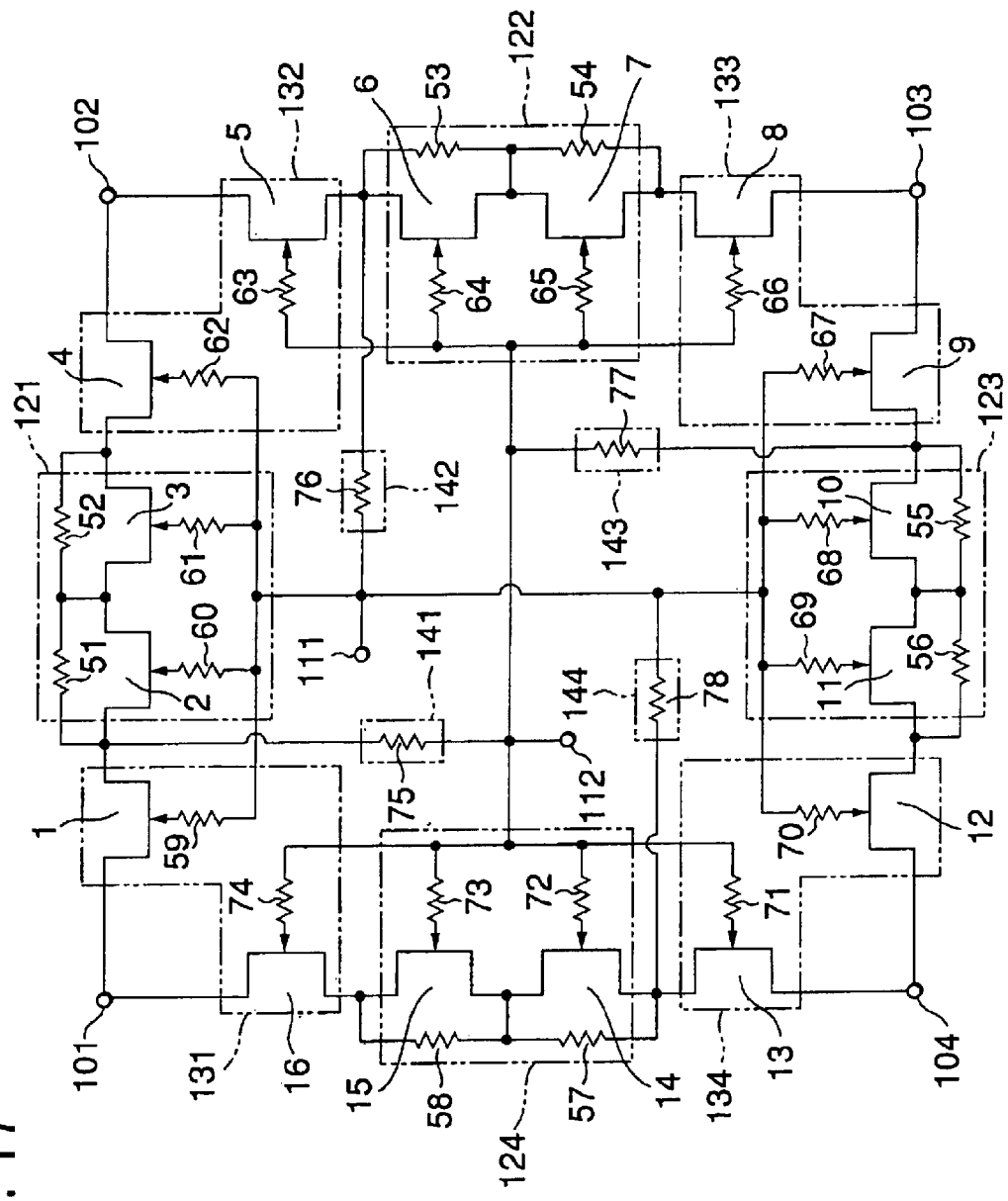
FIG. 17 is a circuit diagram showing the seventh embodiment of a high frequency switch circuit according to the present invention.

FIG. 17 is a circuit diagram showing the seventh embodiment of a high frequency switch circuit according to the present invention. The seventh embodiment will be explained with reference to FIG. 17.

In the high frequency switch circuit according to the seventh embodiment, DC potential isolating sections 131 to 134 adopt the arrangement shown in FIG. 4D, high frequency semiconductor switch sections 121 to 124 adopt the arrangement shown in FIG. 5B, and potential transmission sections 141 to 144 adopt the arrangement shown in FIG. 6A. The high frequency switch circuit according to the seventh embodiment exhibits the same operations and effects as those of the high frequency switch circuit according to the fourth embodiment.

Figure 18:
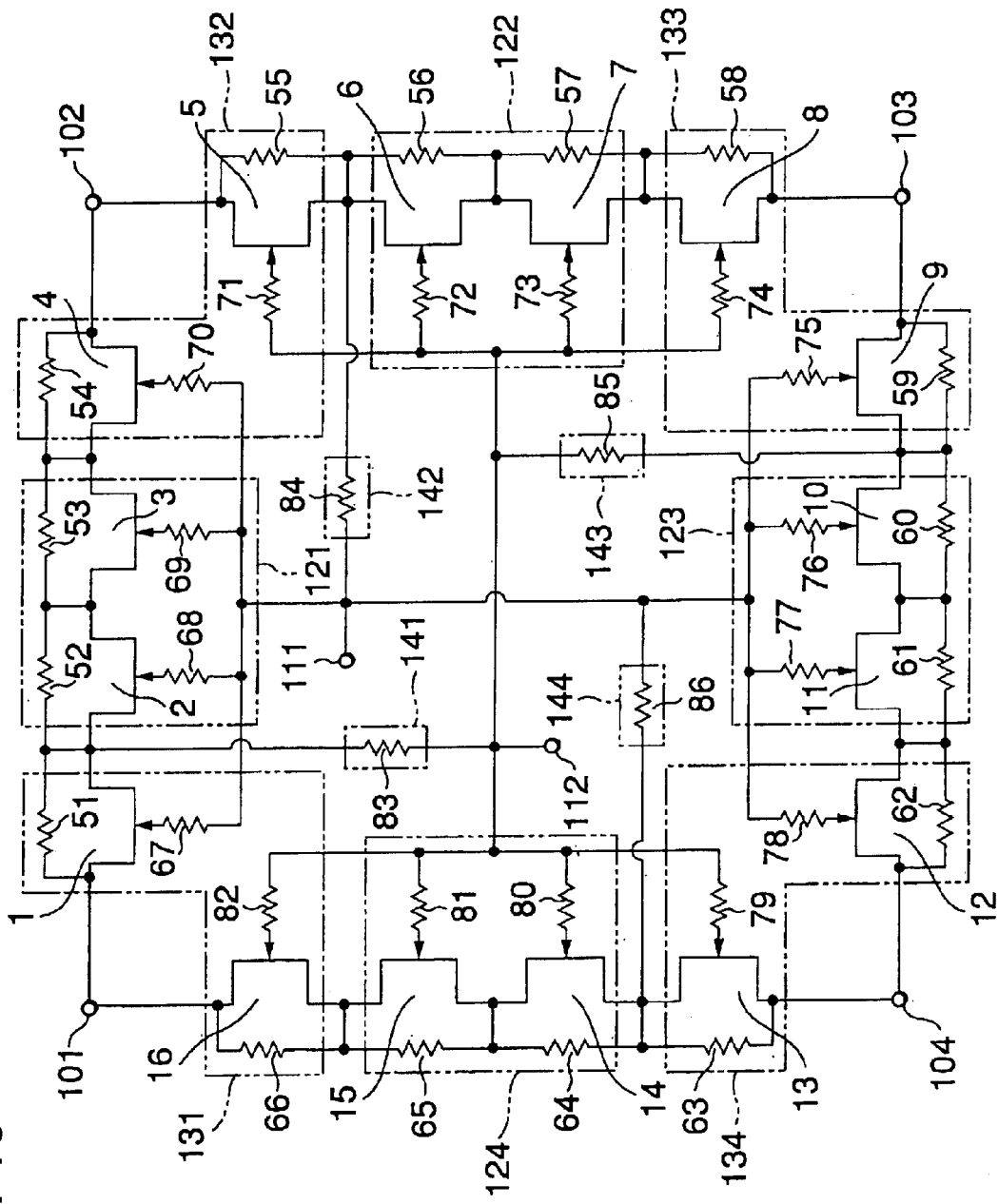
FIG. 18 is a circuit diagram showing the eighth embodiment of a high frequency switch circuit according to the present invention.

FIG. 18 is a circuit diagram showing the eighth embodiment of a high frequency switch circuit according to the present invention. The eighth embodiment will be explained with reference to FIG. 18.

In the high frequency switch circuit according to the eighth embodiment, DC potential isolating sections 131 to 134 adopt the arrangement shown in FIG. 4E, high frequency semiconductor switch sections 121 to 124 adopt the arrangement shown in FIG. 5B, and potential transmission sections 141 to 144 adopt the arrangement shown in FIG. 6A. The high frequency switch circuit according to the eighth embodiment exhibits the same operations and effects as those of the high frequency switch circuit according to the fourth embodiment.

What is claimed is:

1. A high frequency switch circuit, comprising:
   a plurality of high frequency terminals which input/output a high frequency signal,
   a plurality of high frequency semiconductor switch sections which are arranged on lines coupling said high frequency terminals,
   a DC potential isolating circuit which isolates said plurality of high frequency semiconductor switch sections from each other in a DC state, and
   a plurality of DC potential transmission sections, each DC potential transmission section coupling a control side of an associated high frequency semiconductor switching section to at least one of an input side and an output side of another one of said plurality of high frequency semiconductor switch sections.

2. A high frequency switch circuit according to claim 1, wherein:
   each of said plurality of high frequency semiconductor switch sections comprises a field effect transistor having a gate electrode, a drain electrode, and a source electrode, the drain electrode and source electrode being connected between a pair of said high frequency terminals,
   said DC potential isolating circuit comprises a capacitive element,
   said gate electrode comprises said control side of the high frequency semiconductor switch section, and
   said drain and source electrodes comprise said input and output sides of the high frequency semiconductor switch section.

3. A high frequency switch circuit according to claim 1, wherein:
   each of said plurality of high frequency semiconductor switch sections comprises a plurality of field effect transistors, each field effect transistor having a gate electrode, a drain electrode, and a source electrode, said field effect transistors being series-connected by the drain and source electrodes between a pair of said high frequency terminals,
   said DC potential isolating circuit comprises a capacitive element,
   said gate electrodes comprise said control sides of said high frequency semiconductor switch sections, and
   said drain and source electrodes comprise said input and output sides of said high frequency semiconductor switch sections.

4. A high frequency switch circuit comprising: first, second, and third high frequency terminals which input/output high frequency signals;
   a first high frequency semiconductor switch section which is connected between said third high frequency terminal and said first high frequency terminal;
   a second high frequency semiconductor switch section which is connected between said third high frequency terminal and said second high frequency terminal;
   a first switching signal terminal which controls switching operation of said first high frequency semiconductor switch section;
   a second switching signal terminal which controls switching operation of said second high frequency semiconductor switch section;
   a DC potential isolating section which is connected between said third high frequency terminal and said first and second high frequency semiconductor switch sections, and isolates said first high frequency semiconductor switch section and said second high frequency semiconductor switch section in a DC state;
   a first potential transmission section which is connected between said second switching signal terminal and said first high frequency terminal, and applies to said first high frequency terminal a DC potential applied to said second switching signal terminal; and
   a second potential transmission section which is connected between said first switching signal terminal and said second high frequency terminal, and applies to said second high frequency terminal a DC potential applied to said first switching signal terminal.

5. A high frequency switch circuit comprising:
   first, second, third, and fourth high frequency terminals which input/output high frequency signals;
   a first high frequency semiconductor switch section which is connected between said first high frequency terminal and said second high frequency terminal;

a second high frequency semiconductor switch section which is connected between said second high frequency terminal and said third high frequency terminal;

a third high frequency semiconductor switch section which is connected between said third high frequency terminal and said fourth high frequency terminal;

a fourth high frequency semiconductor switch section which is connected between said fourth high frequency terminal and said first high frequency terminal;

a first switching signal terminal which controls switching operation of said first and third high frequency semiconductor switch sections;

a second switching signal terminal which controls switching operation of said second and fourth high frequency semiconductor switch sections;

a first DC potential isolating section which is connected between said first high frequency terminal and said fourth and first high frequency semiconductor switch sections, and isolates said fourth high frequency semiconductor switch section and said first high frequency semiconductor switch section in a DC state;

a second DC potential isolating section which is connected between said second high frequency terminal and said first and second high frequency semiconductor switch sections, and isolates said first high frequency semiconductor switch section and said second high frequency semiconductor switch section in the DC state;

a third DC potential isolating section which is connected between said third high frequency terminal and said second and third high frequency semiconductor switch sections, and isolates said second high frequency semiconductor switch section and said third high frequency semiconductor switch section in the DC state;

a fourth DC potential isolating section which is connected between said fourth high frequency terminal and said third and fourth high frequency semiconductor switch sections, and isolates said third high frequency semiconductor switch section and said fourth high frequency semiconductor switch section in the DC state;

a first potential transmission section which is connected between said second switching signal terminal and at least one of an input side and an output side of said first high frequency semiconductor switch section, and applies to said at least one of the input side and the output side a DC potential applied to said second switching signal terminal;

a second potential transmission section which is connected between said first switching signal terminal and at least one of an input side and an output side of said second high frequency semiconductor switch section, and applies to said at least one of the input side and the output side a DC potential applied to said first switching signal terminal;

a third potential transmission section which is connected between said second switching signal terminal and at least one of an input side and an output side of said third high frequency semiconductor switch section, and applies to said at least one of the input side and the output side a DC potential applied to said second switching signal terminal; and a fourth potential transmission section which is connected between said first switching signal terminal and at least one of an input side and an output side of said fourth high frequency semiconductor switch section, and applies to said at least one of the input side and the output side a DC potential applied to said first switching signal terminal.

6. A high frequency switch circuit according to claim 4, wherein said DC potential isolating section comprises a capacitive element which is connected between said third high frequency terminal and one of said first and second high frequency semiconductor switch sections, or between said third high frequency terminal and the other of said first and second high frequency semiconductor switch sections.

7. A high frequency switch circuit according to claim 4, wherein said DC potential isolating section comprises:

a first field effect transistor having a drain electrode and a source electrode which are connected between said third high frequency terminal and one of said first and second high frequency semiconductor switch sections, a second field effect transistor having a drain electrode and a source electrode which are connected between said third high frequency terminal and the other of said first and second high frequency semiconductor switch sections, and first and second resistance elements which are connected between gate electrodes of said first and second field effect transistors, respectively, and said switching signal terminal.

8. A high frequency switch circuit according to claim 4, wherein said DC potential isolating section comprises:

a first field effect transistor having a drain electrode and a source electrode which are connected between said third high frequency terminal and one of said first and second high frequency semiconductor switch sections, a second field effect transistor having a drain electrode and a source electrode which are connected between said third high frequency terminal and the other one of said first and second high frequency semiconductor switch sections, first and second resistance element which are connected between gate electrodes of said first and second field effect transistors, respectively, and said switching signal terminal, and third and fourth resistance elements, each of which is connected between the drain electrode and the source electrode of an associated one of said field effect transistors.

9. A high frequency switch circuit according to claim 4, wherein each high frequency semiconductor switch section comprises a field effect transistor having a drain electrode and a source electrode which are connected between said high frequency terminals connected/disconnected by said high frequency semiconductor switch section, a resistance element which is connected between a gate electrode of the field effect transistor and the associated switching signal terminal for controlling said high frequency semiconductor switch section, and a resistance element which is connected between the drain electrode and the source electrode of the field effect transistor.

10. A high frequency switch circuit according to claim 4, wherein each high frequency semiconductor switch section comprises:

a plurality of field effect transistors, each transistor having a gate electrode, a drain electrode, and a source electrode, said field effect transistors being series-connected by the drain and source electrodes between said high frequency terminals connected/disconnected by the high frequency semiconductor switch section, a first plurality of resistance elements which are connected between gate electrodes of the field effect transistors and said switching signal terminals for controlling said high frequency semiconductor switch sections, and a second plurality of resistance elements which are connected between the drain electrodes and the source electrodes of the field effect transistor.

11. A high frequency switch circuit according to claim 4, wherein each potential transmission section comprises a resistance element.

12. A high frequency switch circuit according to claim 4, wherein each potential transmission section comprises a resistance element and an inductor element which are series-connected.

13. A high frequency switch circuit according to claim 1, wherein each high frequency switch circuit is integrated in one semiconductor chip.

14. A high frequency switch circuit according to claim 5, wherein each DC potential isolating section comprises a capacitive element which is connected between the associated high frequency terminal and one of the associated high frequency semiconductor switch sections, or between the associated high frequency terminal and the other one of the associated high frequency semiconductor switch sections.

15. A high frequency switch circuit according to claim 5, wherein said DC potential isolating section comprises:

a first field effect transistor having a drain electrode and a source electrode which are connected between the associated high frequency terminal and one of the associated high frequency semiconductor switch section sections, a second field effect transistor having a drain electrode and a source electrode which are connected between the associated high frequency terminal and the other of the associated high frequency semiconductor switch sections, and first and second resistance elements which are connected between gate electrodes of said first and second field effect transistors, respectively, and said switching signal terminal.

16. A high frequency switch circuit according to claim 5, wherein said DC potential isolating section comprises:

a first field effect transistor having a drain electrode and a source electrode which are connected between the associated high frequency terminal and one of the associated high frequency semiconductor switch sections, a second field effect transistor having a drain electrode and a source electrode which are connected between the associated high frequency terminal and the other of the associated high frequency semiconductor switch sections, first and second resistance element which are connected between gate electrodes of said first and second field effect transistors, respectively, and said switching signal terminal, and third and fourth resistance elements, each of which is connected between the drain electrode and the source electrode of an associated one of said field effect transistors.

17. A high frequency switch circuit according to claim 5, wherein each high frequency semiconductor switch section comprises a field effect transistor having a drain electrode and a source electrode which are connected between said high frequency terminals connected/disconnected by said high frequency semiconductor switch section, a resistance element which is connected between a gate electrode of the field effect transistor and the associated switching signal terminal for controlling said high frequency semiconductor switch section, and a resistance element which is connected between the drain electrode and the source electrode of the field effect transistor.

18. A high frequency switch circuit according to claim 5, wherein each high frequency semiconductor switch section comprises:

a plurality of field effect transistors, each transistor having a gate electrode, a drain electrode and a source electrode, said field effect transistors being series-connected by the drain and source electrodes between said high frequency terminals connected/disconnected by said the high frequency semiconductor switch section, a first plurality of resistance elements which are connected between gate electrodes of the field effect transistors and said switching signal terminals for controlling said high frequency semiconductor switch sections, and a second plurality of resistance elements which are connected between the drain electrodes and the source electrodes.

19. A high frequency switch circuit according to claim 5, wherein each potential transmission section comprises a resistance element.

20. A high frequency switch circuit according to claim 5, wherein each potential transmission section comprises a resistance element and an inductor element which are series connected.

* * * * *